United States Patent
Arteaga Muller et al.

(10) Patent No.: US 12,173,403 B2
(45) Date of Patent: Dec. 24, 2024

(54) GROUP 6 TRANSITION METAL-CONTAINING COMPOSITIONS FOR VAPOR DEPOSITION OF GROUP 6 TRANSITION METAL-CONTAINING FILMS

(71) Applicant: L'Air Liquide, Société Anonyme pour l'Etude et l'Exploitation des Procédés Georges Claude, Paris (FR)

(72) Inventors: Rocio Alejandra Arteaga Muller, Yokosuka (JP); Raphael Rochat, Yokohama (JP); Antonio Sanchez, Tsukuba (JP); Jean-Marc Girard, Versailles (FR); Nicolas Blasco, Grenoble (FR); Santiago Marques-Gonzalez, Tsukuba (JP); Clément Lansalot-Matras, Plélo (FR); Jooho Lee, Seoul (KR); Zhiwen Wan, Plano, TX (US)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 365 days.

(21) Appl. No.: 17/244,990

(22) Filed: Apr. 30, 2021

(65) Prior Publication Data
US 2021/0246553 A1    Aug. 12, 2021

Related U.S. Application Data

(62) Division of application No. 15/994,961, filed on May 31, 2018, now Pat. No. 11,021,793.

(51) Int. Cl.
C23C 16/455    (2006.01)
C07F 11/00    (2006.01)

(52) U.S. Cl.
CPC ........ C23C 16/45553 (2013.01); C07F 11/00 (2013.01); C07F 11/005 (2013.01)

(58) Field of Classification Search
CPC ... C23C 16/45553; C07F 11/005; C07F 11/00
(Continued)

(56) References Cited

U.S. PATENT DOCUMENTS 3,691,144 A * 9/1972 Zuech .................. B01J 31/143
                                                          526/138
4,138,448 A * 2/1979 Minchak ................ C08G 61/08
                                                          525/289
(Continued)

FOREIGN PATENT DOCUMENTS

JP         6324609          5/2018
WO    WO 2007 000186       6/2005
(Continued)

OTHER PUBLICATIONS

Abramenko, V.L. et al., Investigation of electrolyte properties of $MoO_2Cl_2$ in organic solvents, Zhurnal Obshchei Khimii (1978), 49(10) 2177-2182 and English translation.
(Continued)

*Primary Examiner* — Michael G Miller
(74) *Attorney, Agent, or Firm* — Allen E. White; Patricia E. McQueeney

(57) ABSTRACT

Disclosed are Group 6 transition metal-containing thin film forming precursors to deposit Group 6 transition metal-containing films on one or more substrates via vapor deposition processes.

4 Claims, 20 Drawing Sheets

(58) Field of Classification Search
USPC ........ 427/248.1–255.7; 423/53–61, 491–492
See application file for complete search history.

(56) References Cited

U.S. PATENT DOCUMENTS

| | | |
|---|---|---|
| 4,195,014 A | 3/1980 | Dorfman et al. |
| 6,534,431 B1* | 3/2003 | Suntola .................. B01J 29/061 502/355 |
| 6,706,115 B2 | 3/2004 | Leskela et al. |

FOREIGN PATENT DOCUMENTS

| | | |
|---|---|---|
| WO | WO 2016 024407 | 2/2016 |
| WO | WO 2017 194955 | 11/2017 |
| WO | WO 2018 234285 | 12/2018 |

OTHER PUBLICATIONS

Abramenko, V.L. et al., Physico-chemical investigation of complexing between $MoO_2Cl_2$ and oxygen-containing organic compounds, Zhurnal Obshchei Khimii (1976), 47(11) 2444-2449 and English translation.

Al-Ajlouni, A. et al., Kinetics of cyclooctene epoxidation with tert-butyl hydroperoxide in the presence of $[MoO_2X_2L]$-type catalysts (L = bidentate Lewis base), Eur. J. Inorg. Chem. 2005, 1716-1723.

Arnaiz, F.J. et al., Addition compounds of dichlorodioxomolybdenum(VI) from hydrochloric acid solutions of molybdenum trioxide. Crystal structure of dichlorodioxodiaquamolymbehunm(VI) Bis(2,5,8-trioxanonane), Polyhedron, 1994, vol. 13, No. 19, 2745-2749.

Barea, G. et al., Cis, trans,cis or all-cis geometry in $d^0$ octahedral dioxo complexes. An IMOMM study of the role of steric effects, Inorg. Chem. 1998, 37, 3321-3325.

Brown, M.D. et al., Synthesis, spectroscopic and structural properties of hexavalent molybdenum complexes with thio- and selenoether ligands, Dalton Trans., 2004, 2487-2491.

Chiu, H.T. et al., Syntheses and x-ray crustal structures of dichlorobis(tert-butylimido) complexes of molybdenum(VI); potential precursors to molybdenum nitride and molybdenum carbonitride, Journal of the Chinese Chemical Society, 1994, vol. 41, 755-761, Abstract.

Davis, M.F. et al., Tungsten(VI) and molybdenum(VI) complexes with soft thioether ligand coordination—synthesis, spectroscopic and structural studies, Eur. J. Inorg. Chem. 2007, 1903-1910.

Dreisch, K. et al., Synthesis of $MO_2Cl_2(N,N,N',N'$-tetramethylethylenediamine) (M = Mo and W) and crustal structure of $WO_2Cl_2(N, N, N', N'$-tetramethylethylenediamine)—an unprecedented coordination geometry in the $WO_2Cl_2$ core, Polyhedron 1992, vol. 11, No. 17, 2143-2150.

Gago, S. et al., Immobilization of oxomolybdenum species in a layered double hydroxide pillared by 2,2'-bipyridine-5,5'-dicarboxylate anions, Inorg. Chem. 2004, 43, 5422-5431.

Jeyakumar, K. et al., Application of molybdenum(VI) dichloride dioxide ($MoO_2Cl_2$) in organic transformations, J. Chem. Sci. vol. 121, No. 2, Mar. 2009, 111-123.

Kamenar, B. et al., Preparation and crystal structure of two oxomolybdenum complexes with dimethoxyethane, Inorganica Chimica Acta, 65 (1982), L245-L257.

King, B.R. (ed.), 3. Complexes with O-donor atoms. 3.1 Molybdates and oxomolybdenum complexes, Encyclopedia of Inorganic Chemistry, $2^{nd}$ ed., 2005, John Wiley & Sons Ltd., Chichester, West Sussex, UK, 3294-3295.

Krauss, H.-L. et al., Über nicht-salzartige Molbydän(VI)-Komplexe, Chem. Berich., 1961, 94, 2864-2876 and machine translation.

Kühn, F.E. et al., Bis-acetonitrile(dibromo)dioxomolybdenum(VI) and derivatives: synthesis, reactivity, structures and catalytic applications, Journal of Organometallic Chemistry 583 (1999) 3-10.

Larson, M.L. et al., Coordination chemistry of molybdenum oxochlorides, Inorganic Chemistry, vol. 5, No. 5, May 1966, 801-805.

Miikkulainen, V. et al., Bis(tert-butylimido)-bis(dialkylamido) complexes of molybdenum as atomic layer deposition (ALD) precursors for molybdenumnitride: the effect of the alkyl group, Chem. Vap. Deposition 2008, 14, 71-77.

Mouat, A.R. et al., Volatile hexavalent oxo-amidinate complexes: molybdenum and tungsten precursors for ALD, Chem. Mater. 2016, 28, 1907-1919.

Öcal, J., Reactions of oxomolybdenum compounds with nitrogen donor ligands and related computational calculations, Master Thesis, Graduate School of Engineering and Science, Izmir Institute of Technology, Izmir, TU, Sep. 2009, 87 pages.

Oliviera, T.S.M. et al., Dichlorodioxomolybdenunm(VI) complexes bearing oxygen-donor ligands as olefin epoxidation catalysts, Dalton Trans., Jul. 7, 2015, 14139-14148.

Plyushcheva, S.V., Metallization problems in microelectronics. Preparation of high-purity tungsten and molybdenum, Metal 2009, May 19-21, 2009, Hradec nad Moravici, 1-6.

International Search Report and Written Opinion for corresponding PCT/US2019/034868, Nov. 5, 2019.

Tomé, C.M. et al., Use of $MoO_2Cl_2(DMF)_2$ as a precursors for molybdate promoted hydrolysis of phosphoester bonds, Dalton Transactions, 2013, 42, 3901-3907.

* cited by examiner

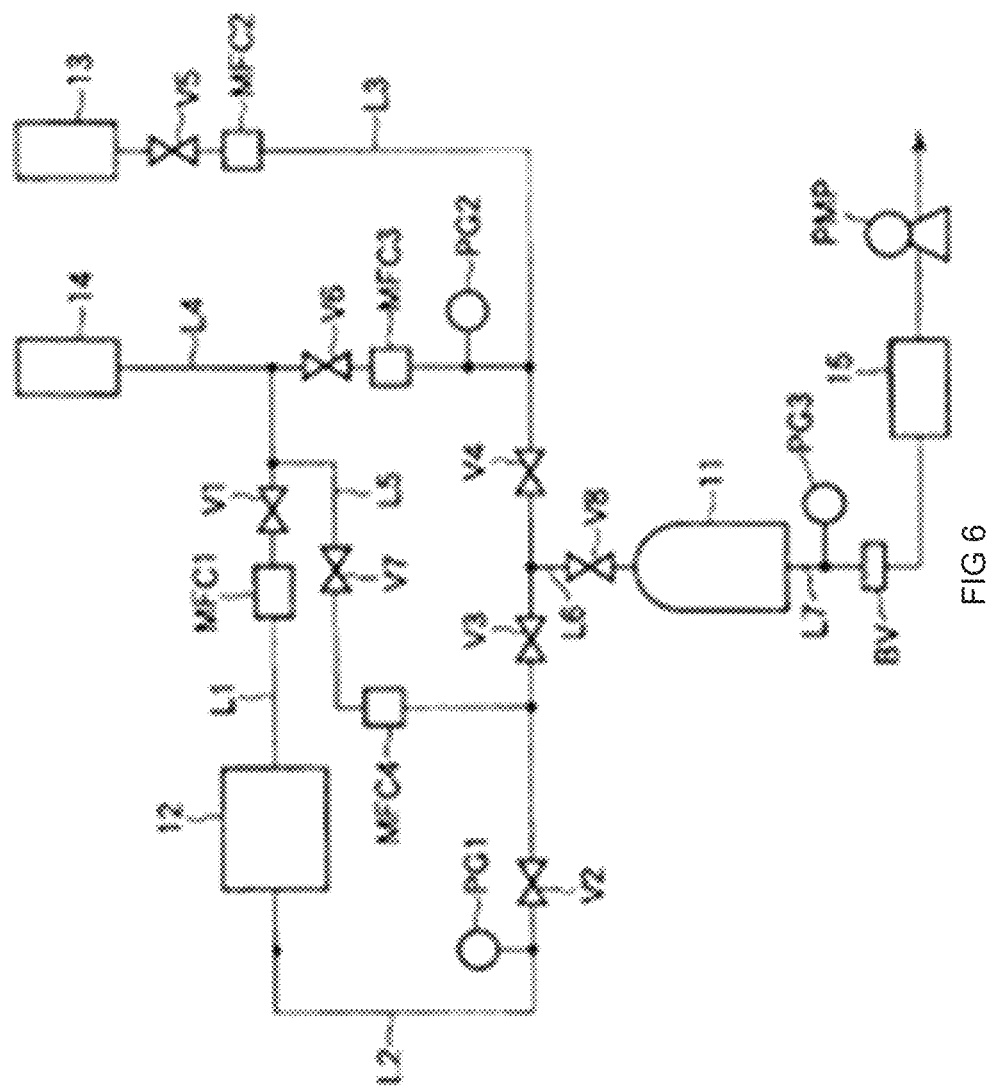

GROUP 6 TRANSITION METAL-CONTAINING COMPOSITIONS FOR VAPOR DEPOSITION OF GROUP 6 TRANSITION METAL-CONTAINING FILMS

CROSS REFERENCE TO RELATED APPLICATIONS

This is a divisional application of U.S. patent application Ser. No. 15/994,961, filed May 31, 2018, the entire contents of which are incorporated herein by reference.

TECHNICAL FIELD

Disclosed are Group 6 transition metal-containing thin film forming compositions to deposit Group 6 transition metal-containing films on one or more substrates via vapor deposition processes.

BACKGROUND

Molybdenum and tungsten finds many different applications in the fabrication of nano-devices.

Vapor deposition of Mo, MoO, MoN, and MoS films from $MoO_2Cl_2$ and/or $MoOCl_4$ has been reported. See, e.g., U.S. Pat. App. Pub. No. 2017/062224 to Applied Materials, Inc.; U.S. Pat. No. 6,416,890 to Glaverbel; U.S. Pat. App. Pub. No. 2018/019165 to Entegris, Inc.; Gesheva et al., Solar Energy Materials, 3, 1980, 415-424; Shinde et al., NPG Asia Materials 2018 10, e468; Hillman et al., Mater Res Bull. 16, 1981, 1345-1359; Chain et al., Thin Solid Films, 1985 123, 3, 197-211; U.S. Pat. App. Pub. No. 2014/023907 to Nth-Degree Technologies Worldwide, Inc.; and GB Pat App Pub No 2548628 to Oxford University Innovation Limited.

Mo containing films, such as $Mo_3Si$ or $MoSi_2$, were deposited onto Si substrates using $MO_2Cl_2$ by means of CVD at temperatures above 600° C. —Journal of Electrochemical Society (1967), 114(2), 201-4.

Vapor deposition of W, WO, WN, and WS films from $WO_2Cl_2$ and/or $WOCl_4$ has been reported. See, e.g., GB Pat App Pub No 2548628 to Oxford University Innovation Limited; U.S. Pat. No. 7,959,891 to Yeda Research & Development Company Ltd. et al.; JP Pat App Pub No 2006/028572 to Ulvac Japan, Ltd.; Boran et al., Jilin Daxue Ziran Kexue Xuebao, 1996, 3, 49-52; and JP Pat No 102942956 to Applied Materials, Inc.

The $MoO_2Cl_2$, $MoOCl_4$, $WO_2Cl_2$, and/or $WOCl_4$ precursors are solid at room temperature and atmospheric pressure. The difficulties of performing vapor deposition from solid precursors is well known. See, e.g., U.S. Pat. No. 6,984,415 to McFeely et al. and PCT Pub No. WO2012/168924 to L'Air Liquide, Societe Anonyme pour l'Etude et l'Exploitation des Procedes Georges Claude.

Synthesis and characterization of adducts of Mo and W halides and oxyhalides have been reported. See, e.g., Oliveira et al., Dalton Trans., 2015,44, 14139-14148; Brown et al., Dalton Trans., 2004, 0, 2487-2491; Kühn et al., Journal of Organometallic Chemistry 1999, 583, 3-10; Al-Ajlouni et al., Eur. J. Inorg. Chem. 2005, 1716-1723; Larson et al., Inorganic Chemistry, 1966, 5, 5, 801-805; Master Thesis Jale ÖCAL, 2009, Reactions of oxomolybdenium compounds with N donor ligands and related computational calculations; Krauss et al., Chem. Berich., 1961, 94, 2864-2876; Marchetti et al., Dalton Trans., 2013, 42, 2477; Kamenar et al., Inorganica Chimica Acta, 65, 1982, L245-L247; Arnaiz et al., Polyhedron, 1994, 13, 19, 2745-2749; Barea et al., Inorg. Chem. 1998, 37, 3321-3325; and Davis et al., Eur. J. Inorg. Chem., 2007, 1903-1910.

A need remains for developing Group 6 precursor molecules suitable for vapor phase deposition with controlled thickness and composition at high temperature.

SUMMARY

Group 6 transition metal-containing film forming compositions are disclosed. The Group 6 transition metal-containing film forming compositions comprise a precursor having the formula MEE'XX', MEXX'X"X'", MEE'XX'·$L_n$, or MEXX'X"X'"·L, wherein M=Mo or W; E=O or S; X=Cl, Br, or I; L is an adduct; and n=1 or 2. The disclosed Group 6 transition metal-containing film forming compositions may include on or more of the following aspects:

- the precursor having the formula MEE'XX';
- the precursor being Mo(=O)$_2$Cl$_2$;
- the precursor being Mo(=S)$_2$Cl$_2$;
- the precursor being Mo(=O)(=S)Cl$_2$;
- the precursor being W(=O)$_2$Cl$_2$;
- the precursor being W(=S)$_2$Cl$_2$;
- the precursor being W(=O)(=S)Cl$_2$;
- the precursor being Mo(=O)$_2$Br$_2$;
- the precursor being Mo(=S)$_2$Br$_2$;
- the precursor being Mo(=O)(=S)Br$_2$;
- the precursor being W(=O)$_2$Br$_2$;
- the precursor being W(=S)$_2$Br$_2$;
- the precursor being W(=O)(=S)Br$_2$;
- the precursor being Mo(=O)$_2$I$_2$;
- the precursor being Mo(=S)$_2$I$_2$;
- the precursor being Mo(=O)(=S)I$_2$;
- the precursor being W(=O)$_2$I$_2$;
- the precursor being W(=S)$_2$I$_2$;
- the precursor being W(=O)(=S)I$_2$;
- the composition comprising between approximately 0% w/v and 5% w/w of MEE'XHX'H;
- the composition comprising between approximately 0% w/v and 5% w/w of MO$_2$(HCl)$_2$;
- the precursor having the formula MEEXX'X"X'";
- the precursor being Mo(=O)Cl$_4$;
- the precursor being Mo(=S)Cl$_4$;
- the precursor being W(=O)Cl$_4$;
- the precursor being W(=S)Cl$_4$;
- the precursor being Mo(=O)Br$_4$;
- the precursor being Mo(=S)Br$_4$;
- the precursor being W(=O)Br$_4$;
- the precursor being W(=S)Br$_4$;
- the precursor being Mo(=O)I$_4$;
- the precursor being Mo(=S)I$_4$;
- the precursor being W(=O)I$_4$;
- the precursor being W(=S)I$_4$,
- the precursor having the formula MEE'XX'·$L_n$;
- L being selected from the group consisting of ketones (R—C(=O)—R), amides (R—C(=O)—NR$_2$), diamides (R$_2$N—C(O)—CH$_2$—C(O)—NR$_2$), nitriles (R—C≡N), isonitriles (RN=C), sulfides (R$_2$S), sulfoxides (R$_2$SO), esters (R—C(=O)—OR), di-esters (R—O—C(=O)—CH$_2$—C(=O)—O—R), ether (R—O—R), polyether (R—O)n, amines (NR$_3$), or anhydrides (R—C(=O)—O—C(=O)—R), with each R independently H or a C1-C10 hydrocarbon and n=1-10;
- L being selected from the group consisting of ketones (R—C(=O)—R), diamides (R$_2$N—C(O)—CH$_2$—C (O)—NR$_2$), formamide (H—C(O)—NR$_2$), acetamide (Me-C(O)—NR$_2$), nitriles (R—C≡N), sulfides (R$_2$S), esters (R—C(=O)—OR), di-ester (R—O—C(=O)—CH$_2$—C(=O)—O—R), ether (R—O—R), polyether (R—O)$_n$, or anhydrides (R—C(=O)—O—C(=O)—R), with each R independently H or a C1-C10 hydrocarbon and n=1-10;
L not being tetrahydrofuran (THF), tetramethyletheylenediamine (TMEDA), or diglyme;
each R independently being H or a C1-C4 hydrocarbon;
each R independently being H or a C5-C10 hydrocarbon;
each R independently being H or a linear C5-C10 hydrocarbon;
L being a nitrile;
the precursor being MoO$_2$Cl$_2$·(tBuCN);
the precursor being MoO$_2$Cl$_2$·(tBuCN)$_2$;
the precursor being MoO$_2$Cl$_2$·(nPrCN);
the precursor being MoO$_2$Cl$_2$·(nPrCN)$_2$;
the precursor being MoO$_2$Cl$_2$·(nC$_5$H$_{11}$C—CN);
the precursor being MoO$_2$Cl$_2$·(nC$_5$H$_{11}$C—CN)$_2$;
the precursor being MoO$_2$Cl$_2$·(iBuCN);
the precursor being MoO$_2$Cl$_2$·(iBuCN)$_2$;
the precursor being MoO$_2$Cl$_2$·(iPrCN);
the precursor being MoO$_2$Cl$_2$·(iPrCN)$_2$;
L being an anhydride;
the precursor being MoO$_2$Cl$_2$·(Valeric Anhydride);
L being a formamide;
the precursor being MoO$_2$Cl$_2$·(H—C(=O)—N"Bu$_2$);
the precursor being MoO$_2$Cl$_2$·(H—C(=O)—N"Bu$_2$)$_2$;
the precursor being MoO$_2$Cl$_2$·(H—C(=O)—NEt$_2$);
the precursor being MoO$_2$Cl$_2$·(H—C(=O)—NEt$_2$)$_2$;
L being an acetamide;
the precursor being MoO$_2$Cl$_2$·(Me-C(=O)—NEt$_2$);
the precursor being MoO$_2$Cl$_2$·(Me-C(=O)—NEt$_2$)$_2$;
L being a diamide;
the precursor being MoO$_2$Cl$_2$·(tetrapropylmalonamide);
L being a ketone;
the precursor being MoO$_2$Cl$_2$·(CH$_3$C(O)C$_4$H$_9$);
the precursor being MoO$_2$Cl$_2$·(CH$_3$C(O)C$_4$H$_9$)$_2$;
L being an ester (R—CO—OR);
the precursor being MoO$_2$Cl$_2$·(methyl hexanoate);
the precursor being MoO$_2$Cl$_2$·(methyl hexanoate)$_2$;
the precursor being MoO$_2$Cl$_2$·(amyl acetate);
the precursor being MoO$_2$Cl$_2$·(amyl acetate)$_2$;
the precursor being MoO$_2$Cl$_2$·(methyl valerate);
the precursor being MoO$_2$Cl$_2$·(methyl valerate)$_2$;
the precursor being MoO$_2$Cl$_2$·(ethyl butyrate);
the precursor being MoO$_2$Cl$_2$·(ethyl butyrate)$_2$;
the precursor being MoO$_2$Cl$_2$·(isobutyl isobutyrate);
the precursor being MoO$_2$Cl$_2$·(isobutyl isobutyrate)$_2$;
the precursor being MoO$_2$Cl$_2$·(methyl heptanoate);
the precursor being MoO$_2$Cl$_2$·(methyl heptanoate)$_2$;
the precursor being MoO$_2$Cl$_2$·(isoamyl acetate);
the precursor being MoO$_2$Cl$_2$·(isoamyl acetate)$_2$;
the precursor being MoO$_2$Cl$_2$·(ethyl isovalerate);
the precursor being MoO$_2$Cl$_2$·(ethyl isovalerate)$_2$;
the precursor being MoO$_2$Cl$_2$·(ethyl 2-methylvalerate);
the precursor being MoO$_2$Cl$_2$(ethyl 2-methylvalerate)$_2$;
the precursor being MoO$_2$Cl$_2$·(isobutyl isovalerate);
the precursor being MoO$_2$Cl$_2$·(isobutyl isovalerate)$_2$;
the precursor being MoO$_2$Cl$_2$·(methyl isovalerate);
the precursor being MoO$_2$Cl$_2$·(methyl isovalerate)$_2$;
the precursor being MoO$_2$Cl$_2$(sec-butyl butyrate);
the precursor being MoO$_2$Cl$_2$(sec-butyl butyrate)$_2$;
the precursor being MoO$_2$Cl$_2$·(butyl isobutyrate);
the precursor being MoO$_2$Cl$_2$·(butyl isobutyrate)$_2$;
the precursor being MoO$_2$Cl$_2$·(ethyl 2-ethylbutyrate);
the precursor being MoO$_2$Cl$_2$·(ethyl 2-ethylbutyrate)$_2$;
the precursor being MoO$_2$Cl$_2$·(ethyl valerate);
the precursor being MoO$_2$Cl$_2$·(ethyl valerate)$_2$;
the precursor being MoO$_2$Cl$_2$·(propyl butyrate);
the precursor being MoO$_2$Cl$_2$·(propyl butyrate)$_2$;
the precursor being MoO$_2$Cl$_2$·(methyl butyrate);
the precursor being MoO$_2$Cl$_2$·(methyl butyrate)$_2$;
the precursor being MoO$_2$Cl$_2$·(cyclohexyl butyrate);
the precursor being MoO$_2$Cl$_2$·(cyclohexyl butyrate)$_2$;
the precursor being MoO$_2$Cl$_2$·(ethyl heptanoate);
the precursor being MoO$_2$Cl$_2$·(ethyl heptanoate)$_2$;
the precursor being MoO$_2$Cl$_2$·(ethyl isobutyrate);
the precursor being MoO$_2$Cl$_2$·(ethyl isobutyrate)$_2$;
the precursor being MoO$_2$Cl$_2$·(tert-butyl acetate);
the precursor being MoO$_2$Cl$_2$·(tert-butyl acetate)$_2$;
the precursor being MoO$_2$Cl$_2$·(ethyl tert-butylacetate);
the precursor being MoO$_2$Cl$_2$·(ethyl tert-butylacetate)$_2$;
the precursor being MoO$_2$Cl$_2$(2-ethyl butylacetate);
the precursor being MoO$_2$Cl$_2$·(2-ethyl butylacetate)$_2$;
the precursor being MoO$_2$Cl$_2$·(butyl propionate);
the precursor being MoO$_2$Cl$_2$·(butyl propionate)$_2$;
the precursor being MoO$_2$Cl$_2$·(tert-butyl propionate),
the precursor being MoO$_2$Cl$_2$·(tert-butyl propionate)$_2$;
the precursor being MoO$_2$Cl$_2$·(cyclohexyl propionate);
the precursor being MoO$_2$Cl$_2$·(cyclohexyl propionate)$_2$;
the precursor being MoO$_2$Cl$_2$·(ethyl 2-chloropropionate);
the precursor being MoO$_2$Cl$_2$·(ethyl 2-chloropropionate)$_2$;
the precursor being MoO$_2$Cl$_2$·(ethyl 3-chloropropionate);
the precursor being MoO$_2$Cl$_2$·(ethyl 3-chloropropionate)$_2$;
L being a di-ester;
the precursor being MoO$_2$Cl$_2$·(dibutyl malonate);
the precursor being MoO$_2$Cl$_2$·(diethyl methylmalonate);
the precursor being MoO$_2$Cl$_2$·(dipropyl malonate);
L being an ether;
the precursor being MoO$_2$Cl$_2$·(Et$_2$O);
the precursor being MoO$_2$Cl$_2$·(Et$_2$O)$_2$;
the precursor being MoO$_2$Cl$_2$·(Bu$_2$O);
the precursor being MoO$_2$Cl$_2$·(Bu$_2$O)$_2$;
L being a polyether;
the precursor being MoO$_2$Cl$_2$("Bu-O—CH$_2$—CH$_2$—O-"Bu);
the precursor being MoO$_2$Cl$_2$(Et-O—CH$_2$—CH$_2$—O-Et);
L being a sulfide;
the precursor being MoO$_2$Cl$_2$·(Pr$_2$S)$_2$;
the precursor being MoO$_2$Cl$_2$·(2-Me-cSC$_4$H$_8$)$_2$;
the precursor being MoO$_2$Cl$_2$·(Et$_2$S)$_2$,
the precursor having the formula MEXX'X"X'"·L;
the precursor being MoOCl$_4$·(tBuCN),
the precursor being MoOCl$_4$·(nPrCN);
the precursor being MoOCl$_4$·(nC$_5$H$_{11}$C—CN);
the precursor being MoOCl$_4$(iBuCN);
the precursor being MoOCl$_4$·(iPrCN);
the precursor being MoOCl$_4$·(Valeric Anhydride);
the precursor being MoOCl$_4$·("Bu-FMD);
the precursor being MoOCl$_4$·(Et-FMD);
the precursor being MoOCl$_4$·(Et Me-amd);
the precursor being MoOCl$_4$·(tetrapropylmalonamide);
the precursor being MoOCl$_4$·(CH$_3$C(O)C$_4$H$_9$);
the precursor being MoOCl$_4$·(methyl hexanoate);
the precursor being MoOCl$_4$·(Et$_2$O);
the precursor being MoOCl$_4$·(Bu$_2$O);
the precursor being MoOCl$_4$("Bu-O—CH$_2$—CH$_2$—O-"Bu);
the precursor being MoOCl$_4$(Et-O—CH$_2$—CH$_2$—O-Et);
the precursor being MoOCl$_4$·(Pr$_2$S);
the precursor being MoOCl$_4$·(2-Me-cSC$_4$H$_8$);
the precursor being MoOCl$_4$·(Et$_2$S).

Also disclosed are Group 6 transition metal-containing film forming composition delivery devices comprising a canister having an inlet conduit and an outlet conduit and containing any of the Group 6 transition metal-containing film forming compositions disclosed above. The disclosed delivery devices may include one or more of the following aspects:

an end of the inlet conduit located above a surface of the Group 6 transition metal-containing film forming composition and an end of the outlet conduit located above the surface of the Group 6 transition metal-containing film forming compositions;

an end of the inlet conduit located above a surface of the Group 6 transition metal-containing film forming composition and an end of the outlet conduit located below the surface of the Group 6 transition metal-containing film forming composition;

an end of the inlet conduit located below a surface of the Group 6 transition metal-containing film forming composition and an end of the outlet conduit located above the surface of the Group 6 transition metal-containing film forming compositions.

Processes are also disclosed for the deposition of Group 6 transition metal-containing films on one or more substrates using any of the Group 6 transition metal-containing film forming compositions disclosed above. At least one Group 6 transition metal-containing thin film forming compositions is introduced into a reactor having at least one substrate disposed therein. At least part of the precursor is deposited onto the at least one substrate to form the Group 6 transition metal-containing film. The disclosed processes may further include one or more of the following aspects:

introducing at least one reactant into the reactor;
the reactant being plasma-treated;
the reactant being remote plasma-treated;
the reactant not being plasma-treated;
the reactant being selected from the group consisting of $H_2$, $H_2CO$, $N_2H_4$, $NH_3$, $SiH_4$, $Si_2H_6$, $Si_3H_8$, $SiH_2Me_2$, $SiH_2Et_2$, $SiHEt_3$, $N(SiH_3)_3$, $GeH_4$, $GeH_2Et_2$, $GeHEt_3$, $B_2H_6$, $B(Me)_3$, $B(Et)_3$, hydrogen radicals thereof, and mixtures thereof;
the reactant being $H_2$;
the reactant being $NH_3$, primary amines, secondary amines, diamines (ethylene diamine, N-substituted ethylene diamines), hydrazine, substituted hydrazines, or mixtures thereof;
the reactant being a sulfur- or selenide-containing reactant, such as $H_2S$, $H_2Se$, dialkylsulfide, dialkylselenide, bis(trialkylsilyl)sulfide, bis(trialkylsilyl)selenide, or combinations thereof;
the reactant being selected from the group consisting of: $O_2$, $O_3$, $H_2O$, $H_2O_2$, NO, $N_2O$, $NO_2$, carboxylic acids, radicals thereof, and mixtures thereof;
the reactant being $H_2O$;
the reactant being plasma treated $O_2$;
the reactant being $O_3$;
the Group 6 transition metal-containing composition and the reactant being introduced into the reactor simultaneously;
the reactor being configured for chemical vapor deposition;
the reactor being configured for plasma enhanced chemical vapor deposition;
the Group 6 transition metal-containing composition and the reactant being introduced into the chamber sequentially;
the reactor being configured for atomic layer deposition;
the reactor being configured for plasma enhanced atomic layer deposition;
the reactor being configured for spatial atomic layer deposition;
the Group 6 transition metal-containing film being a pure Group 6 transition metal thin film;
the Group 6 transition metal-containing film being Mo or W;
the Group 6 transition metal-containing film being a Group 6 transition metal silicide or germanide ($M_kSi_l$ or $M_kGe_l$, wherein M is the Group 6 transition metal and each of k and l is an integer which inclusively range from 1 to 6);
the Group 6 transition metal-containing film being $Mo_3Si$ or $MoSi_2$;
the Group 6 transition metal-containing film being a Group 6 transition metal oxide ($M_nO_m$, wherein M is the Group 6 transition metal and each of n and m is an integer which inclusively range from 1 to 6);
the Group 6 transition metal-containing film being $MoO_2$, $MoO_3$, $W_2O_3$, $WO_2$, $WO_3$, $W_2O_5$;
the Group 6 transition metal-containing film being a Group 6 transition metal nitride ($M_oN_p$, wherein M is the Group 6 transition metal and each of o and p is an integer which inclusively range from 1 to 6);
the Group 6 transition metal-containing film being $Mo_2N$, MoN, $MoN_2$, $W_2N$, WN, $WN_2$;
the Group 6 transition metal-containing film being a Group 6 transition metal oxy-nitride ($M_qO_rN_s$ wherein M is the Group 6 transition metal and each of q, r and s is an integer which inclusively range from 1 to 10);
the Group 6 transition metal-containing film being MoON, $MoO_2N$, $MoON_2$, $Mo_2ON$, WON, $WO_2N$, $WON_2$, $W_2ON$;
the Group 6 transition metal-containing film being a tungsten or molybdenum dichalcogenide such as $MoS_2$, $WS_2$, $MoSe_2$, $WSe_2$, or combinations thereof.

Notation and Nomenclature

Certain abbreviations, symbols, and terms are used throughout the following description and claims, and include:

As used herein, the indefinite article "a" or "an" means one or more.

As used herein, the terms "approximately" or "about" mean±10% of the value stated.

As used herein, the term "comprising" is inclusive or open-ended and does not exclude additional, unrecited materials or method steps; the term "consisting essentially of" limits the scope of a claim to the specified materials or steps and additional materials or steps that do not materially affect the basic and novel characteristics of the claimed invention; and the term "consisting of" excludes any additional materials or method steps not specified in the claim.

As used herein, the chemical formulae containing the doubly-bonded O and S molecules may or may not include the "=" depiction of the double bond. More particularly, one of ordinary skill in the art will recognize that MEE'XX' or MEXX'X"X''' may also be shown as M(=E)(=E')XX' or M(=E)XX'X"X'''. Similarly, $MoO_2Cl_2$, $WO_2Cl_2$, $MoOCl_4$, $WOCl_4$, $MoS_2Cl_2$, $WS_2Cl_2$, $MoSCl_4$, $WSCl_4$, etc. may also be shown as $Mo(=O)_2C_2$, $W(=O)_2Cl_2$, $Mo(=O)Cl_4$, $W(=O)Cl_4$, $Mo(=S)_2C_2$, $W(=S)_2Cl_2$, $Mo(=S)Cl_4$, $W(=S)Cl_4$, etc.

As used herein, the abbreviation "RT" means room temperature or a temperature ranging from approximately 18° C. to approximately 25° C.

As used herein, the term "adduct" means a molecular entity which is formed by direct combination of two separate molecule entities in such a way there is connectivity but no loss of atoms.

As used herein, the abbreviation "EDA" refers to the ethylene diamine adduct and/or reactant (i.e., $H_2N$—$C_2H_4$—$NH_2$); "TFH" refers to tetrahydrofuran; "DMF" refers to dimethylformamide.

As used herein, the terms "vaporization," "sublimation" and "evaporation" are used interchangeably to refer to the general formation of a vapor (gas) from a solid or liquid precursor, regardless of whether the transformation is, for example, from solid to liquid to gas, solid to gas, or liquid to gas.

As used herein, the term "anhydrous" means containing between approximately zero ppmv and approximately 100 ppmv moisture and preferably between approximately zero ppmv and approximately 10 ppmv moisture.

As used herein, the term "hydrocarbyl group" refers to a functional group containing carbon and hydrogen; the term "alkyl group" refers to saturated functional groups containing exclusively carbon and hydrogen atoms. The hydrocarbyl group may be saturated or unsaturated. Either term refers to linear, branched, or cyclic groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the term "aromatic group" refers to cyclic, planar molecules with a ring of resonance bonds that exhibit more stability than other geometric or connective arrangements with the same set of atoms. Exemplary aromatic groups include substituted or unsubstituted phenyl groups (i.e., $C_6R_5$, wherein each R is independently H or a hydrocarbyl group).

As used herein, the abbreviation "Me" refers to a methyl group; the abbreviation "Et" refers to an ethyl group; the abbreviation "Pr" refers to a propyl group; the abbreviation "nPr" refers to a "normal" or linear propyl group; the abbreviation "iPr" refers to an isopropyl group; the abbreviation "Bu" refers to a butyl group; the abbreviation "nBu" refers to a "normal" or linear butyl group; the abbreviation "tBu" refers to a tert-butyl group, also known as 1,1-dimethylethyl; the abbreviation "sBu" refers to a sec-butyl group, also known as 1-methylpropyl; the abbreviation "iBu" refers to an iso-butyl group, also known as 2-methylpropyl; the term "halide" refers to the halogen anions F—, Cl—, Br—, and I—; and the abbreviation "TMS" refers to trimethylsilyl or —$SiMe_3$.

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $M^1{}_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

The standard abbreviations of the elements from the periodic table of elements are used herein. It should be understood that elements may be referred to by these abbreviations (e.g., Si refers to silicon, C refers to carbon, H refers to hydrogen, etc.). However, please note that the abbreviation Ar may refer to the inert gas Argon or the chemical moiety 2,6-$Me_2$-$C_6H_3$ in the chemical formula ArNH($SiMe_3$).

Any and all ranges recited herein are inclusive of their endpoints (i.e., x=1 to 4 or x ranges from 1 to 4 includes x=1, x=4, and x=any number in between), irrespective of whether the term "inclusively" is used.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein:

FIG. 6 is a block diagram that schematically illustrates an exemplary ALD apparatus;

DESCRIPTION OF PREFERRED EMBODIMENTS

Figure 3:
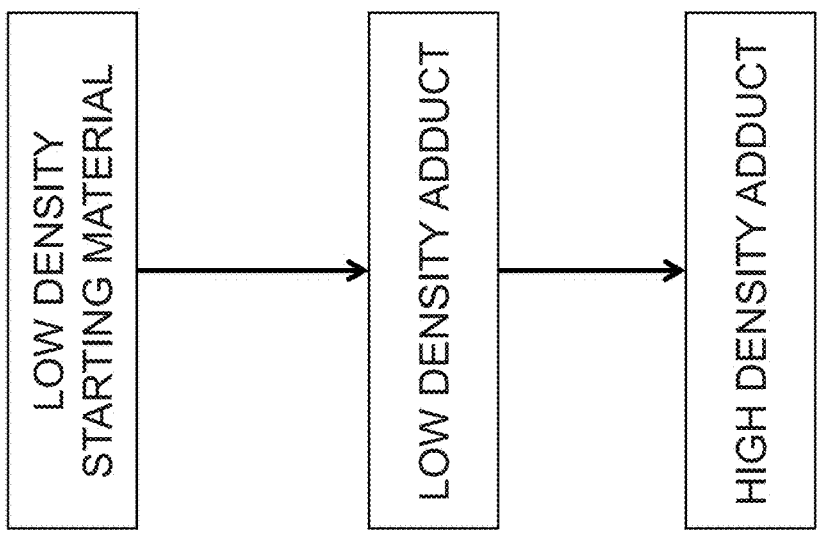
FIG. 3 is a flowchart of one of the disclosed methods to overcome some of the issues encountered in vapor deposition using solid precursors.

Group 6 transition metal-containing film forming compositions are disclosed. Also disclosed are methods of using the same to form Group 6 transition metal-containing films on one or more substrates. The disclosed Group 6 transition metal-containing film forming compositions comprise a Group 6 transition metal containing precursor having the formula MEE'XX' or MEXX'X"X"', wherein M=Mo or W; E=O or S; and X=Cl, Br, or I. In another alternative, the Group 6 transition metal containing precursor may be a MEE'XX'·$L_n$ adduct, wherein M=Mo or W; E=O or S; X=Cl, Br, or I; L is an ligand; and n=1 or 2, provided L is not tetrahydrofuran, tetramethylethylenediamine, or diglyme. In another alternative, the Group 6 transition metal containing precursor may be a MEXX'X"X"'·L adduct, wherein M=Mo or W; E=O or S; X=Cl, Br, or I; and L is an ligand.

L may be selected from ketones (R—C(=O)—R), amides (R—C(=O)—$NR_2$), diamides ($R_2N$—C(O)—$CH_2$—C(O)—$NR_2$), nitriles (R—CEN), isonitriles (RN=C), sulfides ($R_2S$), sulfoxides ($R_2SO$), esters (R—C(=O)—OR), di-esters (R—O—C(=O)—$CH_2$—C(=O)—O—R), ether (R—O—R), polyether (R—O)$_n$, amines ($NR_3$), or anhydrides (R—C(=O)—O—C(=O)—R), with each R independently H or a $C_1$-$C_{10}$ hydrocarbon and n=1-10. Adjacent Rs may form a cyclic structure (e.g., $NR_2$ may be pyridine, pyrrole, etc). One or more Rs may be selected from H or a $C_1$-$C_4$ hydrocarbon to produce a more volatile ligand. Alternatively, one or more Rs may be selected from a $C_5$-$C_{10}$ hydrocarbon to produce a less volatile ligand. In another alternative, one or more Rs that are linear $C_5$-$C_{10}$ hydrocarbon may help produce liquid precursors. Any combination of these alternative may be judicially selected to produce a precursor with the desired stability and volatility.

For MEE'XX'·L, L is preferably selected from the group consisting of ketones (R—C(=O)—R), diamides ($R_2N$—C(O)—$CH_2$—C(O)—$NR_2$), formamide (H—C(O)—$NR_2$), acetamide (Me-C(O)—$NR_2$), nitriles (R—C≡N), sulfides ($R_2S$), esters (R—C(=O)—OR), ether (R—O—R), polyether (R—O)$_n$, and anhydrides (R—C(=O)—O—C(=O)—R).

These precursors must be handled under anhydrous conditions to avoid formation of any hydrated by-products, such as MEE'HXHX'. As a result, the Group 6 transition metal-containing film forming composition contains between approximately 0% w/w and 5% w/w of any MEE'HXHX' by-products, such as $MoO_2(HCl)_2$ as determined by X-Ray Diffraction (XRD). The presence of any hydrated by-products may form HCl and $H_2O$ upon heating. If the disclosed precursors are not handled in moisture-free conditions, the by-products may form a crust on the surface of the precursors that prevents its sublimation.

Exemplary Mo-containing MEE'XX' precursors include $MO(=O)_2Cl_2$, $MO(=S)_2Cl_2$, $MO(=O)(=S)Cl_2$, $Mo(=O)_2Br_2$, $Mo(=S)_2Br_2$, $Mo(=O)(=S)Br_2$, $Mo(=O)_2I_2$, $Mo(=S)_2I_2$, or $Mo(=O)(=S)_{12}$. These precursors may be interesting when the underlying film may be damaged by any halogen-containing by-products. The larger halide containing precursors (i.e., Br or 1) may further be less damaging than the C containing precursors. The halide-metal is also weaker for larger halides, thus enabling reduction based deposition processes at a lower temperature than with C.

Exemplary Mo-containing MEXX'X"X"' precursors include $Mo(=O)Cl_4$, $Mo(=S)Cl_4$, $Mo(=O)Br_4$, $Mo(=S)Br_4$, $Mo(=O)I_4$, or $Mo(=S)I_4$. These precursors may be interesting when little to no oxygen is desired in the resulting film.

Exemplary W-containing MEE'XX' precursors include $W(=O)_2Cl_2$ $W(=S)_2Cl_2$; $W(=O)(=S)Cl_2$, $W(=O)_2Br_2$, $W(=S)_2Br_2$, $W(=O)(=S)Br_2$, $W(=O)_2I_2$, $W(=S)_2I_2$, or $W(=O)(=S)I_2$. These precursors may be interesting when the underlying film may be damaged by any halogen-containing by-products. The larger halide containing precursors (i.e., Br or I) may further be less damaging than the Cl containing precursors.

Exemplary W-containing MEXX'X"X"' precursors include $W(=O)Cl_4$, $W(=S)Cl_4$, $W(=O)Br_4$, $W(=S)Br_4$, $W(=O)I_4$, or $W(=S)I_4$. These precursors may be interesting when little to no oxygen is desired in the resulting film.

Exemplary nitrile adducts include pivalonitrile (tBuCN), butyronitrile (nPrCN), hexanenitrile ($nC_5H_{11}$—CN), isovaleronitrile (iBuCN), or isobutyronitrile (iPrCN).

For example, the Mo- and nitrile-containing MEE'XX' $(L)_n$ precursor may be $MoO_2Cl_2 \cdot (tBuCN)$, $MoO_2Cl_2 \cdot (tBuCN)_2$, $MoO_2Cl_2 \cdot (nPrCN)$, $MoO_2Cl_2 \cdot (nPrCN)_2$, $MoO_2Cl_2 \cdot (nC_5H_{11}C\!\!=\!\!\!\equiv\!\!\!N)$, $MoO_2Cl_2 \cdot (nC_5H_{11}C\!\!=\!\!\!\equiv\!\!\!N)_2$, $MoO_2Cl_2 \cdot (iBuCN)$, $MoO_2Cl_2 \cdot (iBuCN)_2$, $MoO_2Cl_2 \cdot (iPrCN)$, or $MoO_2Cl_2 \cdot (iPrCN)_2$.

Alternatively, the W- and nitrile-containing MEE'XX'$(L)_n$ precursor may be $WO_2Cl_2 \cdot (tBuCN)$, $WO_2Cl_2 \cdot (tBuCN)$, $WO_2Cl_2 \cdot (tBuCN)_2$, $WO_2Cl_2 \cdot (nPrCN)$, $WO_2Cl_2 \cdot (nPrCN)_2$, $WO_2Cl_2 \cdot (nC_5H_{11}C\!\!=\!\!\!\equiv\!\!\!N)$, $WO_2Cl_2 \cdot (nC_5H_{11}C\!\!=\!\!\!\equiv\!\!\!N)_2$, $WO_2Cl_2 \cdot (iBuCN)$, $WO_2Cl_2 \cdot (iBuCN)_2$, $WO_2Cl_2 \cdot (iPrCN)$, and $WO_2Cl_2 \cdot (iPrCN)_2$.

In another alternative, the Mo- and nitrile-containing MEXX'X"X'"$(L)_n$ precursor may be $MoOCl_4 \cdot (tBuCN)$, $MoOCl_4 \cdot (nPrCN)$, $MoOCl_4 (nC_5H_{11}C\!\!=\!\!\!\equiv\!\!\!N)$, $MoOCl_4 \cdot (iBuCN)$, and $MoOCl_4 \cdot (iPrCN)$.

In yet another alternative, the W- and nitrile containing MEXX'X"X'"$(L)_n$ precursor may be $WOCl_4 \cdot (tBuCN)$, $WOCl_4 \cdot (nPrCN)$, $WOCl_4 \cdot (nC_5H_{11}C\!\!=\!\!\!\equiv\!\!\!N)$, $WOCl_4 \cdot (iBuCN)$, and $WOCl_4 \cdot (iPrCN)$.

As shown in the examples that follow, $MoO_2Cl_2(nC_5H_{11}\!\!-\!\!CN)$ is particularly promising for vapor deposition technologies because it is a clear/yellowish, low temperature melting solid (approximately 38° C.). Additionally, $MoO_2Cl_2(nC_5H_{11}\!\!-\!\!CN)$ has a vapor pressure of approximately 8 torr at approximately 100° C.

Exemplary anhydride adducts include valeric anhydride (VA). For example, the VA precursor may be $MoO_2Cl_2 \cdot (VA)$, $WO_2Cl_2 \cdot (VA)$, $MoOCl_4 \cdot (VA)$, or $WOCl_{14} \cdot (VA)$.

Exemplary amide adducts include formamide adducts, such as N,N-dibutylformamide (H—C(O)—NBu$_2$) and N,N-diethylformamide (H—C(O)—NEt$_2$), and acetamide adducts, such as N,N-diethylacetamide (Me-C(O)—NEt$_2$). For example, the amide precursor may be $MoO_2Cl_2 \cdot$(H—C(=O)—N"Bu$_2$)$_2$, $MoO_2Cl_2 \cdot$(H—C(=O)—N"Bu$_2$)$_2$, $MoO_2Cl_2 \cdot$(H—C(=O)—NEt$_2$), $MoO_2Cl_2 \cdot$(H—C(=O)—NEt$_2$)$_2$, $MoO_2Cl_2'$(Me-C(=O)—NEt$_2$), $MoO_2Cl_2 \cdot$(Me-C(=O)—NEt$_2$)$_2$, $WO_2Cl_2 \cdot$(H—C(=O)—N$^1$Bu$_2$)$_2$, $WO_2Cl_2 \cdot$(H—C(=O)—N"Bu$_2$)$_2$, $WO_2Cl_2 \cdot$(H—C(=O)—NEt$_2$), $WO_2Cl_2 \cdot$(H—C(=O)—NEt$_2$)$_2$, $WO_2Cl_2 \cdot$(Me-C(=O)—NEt$_2$), $WO_2Cl_2 \cdot$(Me-C(=O)—NEt$_2$)$_2$, $MoOCl_4 \cdot$(H—C(=O)—N$^1$Bu$_2$), $MoOCl_4 \cdot$(H—C(=O)—NEt$_2$), $MoOCl_4 \cdot$(Me-C(=O)—NEt$_2$), $WOCl_4 \cdot$(H—C(=O)—N$^1$Bu$_2$), $WOCl_4 \cdot$(H—C(=O)—NEt$_2$), or $WOCl_4 \cdot$(Me-C(=O)—NEt$_2$). The $MoO_2Cl_2$(H—C(O)-NBu$_2$)$_n$ and $MoO_2Cl_2$(H—C(O)—NEt$_2$)$_n$ precursors were, however, less volatile than $MoO_2Cl_2$ with other L adducts.

Exemplary diamide adducts include N,N,N',N'-tetrapropylmalonamide (TPMA). For example, the diamide precursor may be $MoO_2Cl_2 \cdot$(TPMA), $WO_2Cl_2 \cdot$(TPMA), $MoOCl_4 \cdot$(TPMA), or $WOCl_4 \cdot$(TPMA).

Exemplary ketone adducts include 2-hexanone (CH$_3$C(O) C$_4$H$_9$). For example, the ketone precursor may be $MoO_2Cl_2 \cdot$(CH$_3$C(O)C$_4$H$_9$), $MoO_2Cl_2 \cdot$(CH$_3$C(O)C$_4$H$_9$)$_2$, $WO_2Cl_2 \cdot$(CH$_3$C(O)C$_4$H$_9$), $WO_2Cl_2 \cdot$(CH$_3$C(O)C$_4$H$_9$)$_2$, $MoOCl_4 \cdot$(CH$_3$C(O)C$_4$H$_9$), or $WOCl_4 \cdot$(CH$_3$C(O)C$_4$H$_9$).

Exemplary ester adducts include methyl hexanoate (MHX), amyl acetate (AA), methyl valerate (MV), ethyl butyrate (EB), isobutyl isobutyare (IIB), methyl heptanoate (MHP), isoamyl acetate (IA), ethyl isovalerate (EI), ethyl 2-methylvalerate (EMV), isobutyl isovalerate (IIV), methyl isovalerate (MI), sec-butyl butyrate (BB), butyl isobutyrate (BIB), ethyl 2-ethylbutyare (EEB), ethyl valerate (EV), propyl butyrate (PB), methyl butyrate (MB), cyclohexyl butyrate (CHB), ethyl heptanoate (EH), ethyl isobutyare (EIB), tert-butyl acetate (TA), ethyl tert-butylacetate (EBA), 2-ethyl butylacetate (2-EBA), butyl propionate (BP), tert-butyl propionate (tBP), cyclohexyl propionate (CHP), ethyl 2-chloropropionate (2-ECP), ethyl 3-chloropropionate (3-ECP), and combinations thereof.

For example, the Mo- and ester-containing precursors include $MoO_2Cl_2 \cdot$(MHX), $MoO_2Cl_2 \cdot$(MHX)$_2$, $MoO_2Cl_2 \cdot$(AA), $MoO_2Cl_2 \cdot$(AA)$_2$, $MoO_2Cl_2 \cdot$(MV), $MoO_2Cl_2 \cdot$(MV)$_2$, $MoO_2Cl_2 \cdot$(EB), $MoO_2Cl_2 \cdot$(EB)$_2$, $MoO_2Cl_2 \cdot$(MHP), $MoO_2Cl_2$(MHP)$_2$, $MoO_2Cl_2 \cdot$(IIB), $MoO_2Cl_2 \cdot$(IIB)$_2$, $MoO_2Cl_2 \cdot$(IA), $MoO_2Cl_2 \cdot$(IA)$_2$, $MoO_2Cl_2 \cdot$(EI), $MoO_2Cl_2 \cdot$(EI)$_2$, $MoO_2Cl_2 \cdot$(EMV), $MoO_2Cl_2 \cdot$(EMV)$_2$, $MoO_2Cl_2 \cdot$(IIV), $MoO_2Cl_2 \cdot$(IIV)$_2$, $MoO_2Cl_2 \cdot$(MI), $MoO_2Cl_2 \cdot$(MI)$_2$, $MoO_2Cl_2 \cdot$(BB), $MoO_2Cl_2 \cdot$(BB)$_2$, $MoO_2Cl_2 \cdot$(BIB), $MoO_2Cl_2 \cdot$(BIB)$_2$, $MoO_2Cl_2 \cdot$(EEB), $MoO_2Cl_2 \cdot$(EEB)$_2$, $MoO_2Cl_2 \cdot$(EV), $MoO_2Cl_2 \cdot$(EV)$_2$, $MoO_2Cl_2 \cdot$(PB), $MoO_2Cl_2 \cdot$(PB)$_2$, $MoO_2Cl_2 \cdot$(MB), $MoO_2Cl_2 \cdot$(MB)$_2$, $MoO_2Cl_2 \cdot$(CHB), $MoO_2Cl_2 \cdot$(CHB)$_2$, $MoO_2Cl_2 \cdot$(EH), $MoO_2Cl_2 \cdot$(EH)$_2$, $MoO_2Cl_2 \cdot$(EIB), $MoO_2Cl_2 \cdot$(EIB)$_2$, $MoO_2Cl_2 \cdot$(TA), $MoO_2Cl_2 \cdot$(TA)$_2$, $MoO_2Cl_2 \cdot$(EBA), $MoO_2Cl_2 \cdot$(EBA)$_2$, $MoO_2Cl_2 \cdot$(2-EBA), $MoO_2Cl_2 \cdot$(2-EBA)$_2$, $MoO_2Cl_2 \cdot$(BP), $MoO_2Cl_2 \cdot$(BP)$_2$, $MoO_2Cl_2 \cdot$(tBP), $MoO_2Cl_2 \cdot$(tBP)$_2$, $MoO_2Cl_2 \cdot$(CHP), $MoO_2Cl_2 \cdot$(CHP)$_2$, $MoO_2Cl_2 \cdot$(2-ECP), $MoO_2Cl_2 \cdot$(2-ECP)$_2$, $MoO_2Cl_2 \cdot$(3-ECP), $MoO_2Cl_2 \cdot$(3-ECP)$_2$, or combinations thereof.

For example, the W- and ester-containing precursors include $WO_2Cl_2 \cdot$(MHX), $WO_2Cl_2 \cdot$(MHX)$_2$, $WO_2Cl_2 \cdot$(AA), $WO_2Cl_2 \cdot$(AA)$_2$, $WO_2Cl_2 \cdot$(MV), $WO2Cl_2 \cdot$(MV)$_2$, $WO_2Cl_2 \cdot$(EB), $WO_2Cl_2 \cdot$(EB)$_2$, $WO_2Cl_2 \cdot$(MHP), $WO_2Cl_2 \cdot$(MHP)$_2$, $WO_2Cl_2 \cdot$(IIB), $WO_2Cl_2 \cdot$(IIB)$_2$, $WO_2Cl_2 \cdot$(IA), $WO_2Cl_2$(IA)$_2$, $WO_2Cl_2 \cdot$(EI), $WO_2Cl_2 \cdot$(EI)$_2$, $WO_2Cl_2 \cdot$(EMV), $WO_2Cl_2 \cdot$(EMV)$_2$, $WO_2Cl_2 \cdot$(IV), $WO_2Cl_2 \cdot$(IIV)$_2$, $WO_2Cl_2 \cdot$(MI), $WO_2Cl_2 \cdot$(MI)$_2$, $WO_2Cl_2 \cdot$(BB), $WO_2Cl_2 \cdot$(BB)$_2$, $WO_2Cl_2 \cdot$(BIB), $WO_2Cl_2 \cdot$(BIB)$_2$, $WO_2Cl_2 \cdot$(EEB), $WO_2Cl_2 \cdot$(EEB)$_2$, $WO_2Cl_2 \cdot$(EV), $WO_2Cl_2 \cdot$(EV)$_2$, $WO_2Cl_2 \cdot$(PB), $WO_2Cl_2 \cdot$(PB)$_2$, $WO_2Cl_2 \cdot$(MB), $WO_2Cl_2 \cdot$(MB)$_2$, $WO_2Cl_2 \cdot$(CHB), $WO_2Cl_2 \cdot$(CHB)$_2$, $WO_2Cl_2 \cdot$(EH), $WO_2Cl_2 \cdot$(EH)$_2$, $WO_2Cl_2 \cdot$(EIB), $WO_2Cl_2 \cdot$(EIB)$_2$, $WO_2Cl_2 \cdot$(TA), $WO_2Cl_2 \cdot$(TA)$_2$, $WO_2Cl_2 \cdot$(EBA), $WO_2Cl_2 \cdot$(EBA)$_2$, $WO_2Cl_2 \cdot$(2-EBA), $WO_2Cl_2 \cdot$(2-EBA)$_2$, $WO_2Cl_2 \cdot$(BP), $WO_2Cl_2 \cdot$(BP)$_2$, $WO_2Cl_2 \cdot$(tBP), $WO_2Cl_2 \cdot$(tBP)$_2$, $WO_2Cl_2 \cdot$(CHP), $WO_2Cl_2 \cdot$(CHP)$_2$, $WO_2Cl_2 \cdot$(2-ECP), $WO_2Cl_2 \cdot$(2-ECP)$_2$, $WO_2Cl_2 \cdot$(3-ECP), $WO_2Cl_2 \cdot$(3-ECP)$_2$, or combinations thereof.

Alternatively, the Mo- and ester-containing precursors include $MoOCl_4 \cdot$(MHX), $MoOCl_4 \cdot$(AA), $MoOCl_4 \cdot$(MV), $MoOCl_4 \cdot$(EB), $MoOCl_4 \cdot$(MHP), $MoOCl_4 \cdot$(IIB), $MoOCl_4 \cdot$(IA), $MoOCl_4 \cdot$(EI), $MoOCl_4 \cdot$(EMV), $MoOCl_4 \cdot$(IIV), $MoOCl_4 \cdot$(MI), $MoOCl_4 \cdot$(BB), $MoOCl_4 \cdot$(BIB), $MoOCl_4 \cdot$(EEB), $MoOCl_4 \cdot$(EV), $MoOCl_4 \cdot$(PB), $MoOCl_4 \cdot$(MB), $MoOCl_4 \cdot$(CHB), $MoOCl_4 \cdot$(EH), $MoOCl_4 \cdot$(EIB), $MoOCl_4 \cdot$(TA), $MoOCl_4 \cdot$(EBA), $MoOCl_4 \cdot$(2-EBA), $MoOCl_4 \cdot$(BP), $MoOCl_4 \cdot$(tBP), $MoOCl_4 \cdot$(CHP), $MoOCl_4 \cdot$(2-ECP), $MoOCl_4 \cdot$(3-ECP), or combinations thereof.

Alternatively, the W- and ester-containing precursors include $WOCl_4 \cdot$(MHX), $WOCl_4 \cdot$(AA), $WOCl_4 \cdot$(MV), $WOCl_4 \cdot$(EB), $WOCl_4 \cdot$(MHP), $WOCl_4 \cdot$(IIB), $WOCl_4 \cdot$(IA), $WOCl_4 \cdot$(EI), $WOCl_4 \cdot$(EMV), $WOCl_4 \cdot$(IIV), $WOCl_4 \cdot$(MI), $WOCl_4 \cdot$(BB), $WOCl_4 \cdot$(BIB), $WOCl_4 \cdot$(EEB), $WOCl_4 \cdot$(EV), $WOCl_4 \cdot$(PB), $WOCl_4 \cdot$(MB), $WOCl_4 \cdot$(CHB), $WOCl_4 \cdot$(EH), $WOCl_4 \cdot$(EIB), $WOCl_4 \cdot$(TA), $WOCl_4 \cdot$(EBA), $WOCl_4 \cdot$(2-EBA), $WOCl_4 \cdot$(BP), $WOCl_4 \cdot$(tBP), $WOCl_4 \cdot$(CHP), $WOCl_4 \cdot$(2-ECP), $WOCl_4 \cdot$(3-ECP), or combinations thereof.

As shown in the examples that follow, $MoO_2Cl_2 \cdot$(MH)$_2$ and $MoO_2Cl_2 \cdot$(AA)$_2$ are particularly promising for vapor deposition technologies because both are a liquid at room temperature and atmospheric pressure. Additionally, $MoO_2Cl_2 \cdot$(MH)$_2$ has a vapor pressure of approximately 14 torr at approximately 100° C. and $MoO_2Cl_2 \cdot$(AA)$_2$ has a vapor pressure of approximately 8.5 torr at approximately 100° C. (as compared to approximately 24 Torr at 100° C. for $MoO_2Cl_2$). The vacuum thermogravimetric analysis (TGA) curves also indicate that $MoO_2Cl_2 \cdot (MH)_2$ and $MoO_2Cl_2 \cdot (AA)_2$ exhibit the stability needed for vapour deposition processes. Applicants were surprised by these results because esters are typically considered difficult adducts because they weakly bind to the metal and tend to produce leaving groups and active organic moieties. While testing is ongoing and as partially demonstrated in the examples that follow, Applicants remain confident that the reaction product between $MoO_2Cl_2$ and the ester is $MoO_2C_2 \cdot L_2$ because esters are not prone to accept oxygen from a metal center and contain no H or C=C to accept Cl.

Exemplary di-ester adducts include dibutyl malonate (DBM), diethyl methylmalonate (DEMM), and dipropyl malonate (DPM). For example, the di-ester precursor may be $MoO_2Cl_2 \cdot (DBM)$, $MoO_2Cl_2 \cdot (DEMM)$, $MoO_2Cl_2 \cdot (DPM)$, $WO_2Cl_2 \cdot (DBM)$, $WO_2Cl_2 \cdot (DEMM)$, $WO_2Cl_2 \cdot (DPM)$, $MoOCl_4$ (DBM), $MoOCl_4 \cdot (DEMM)$, $MoOCl_4 \cdot (DPM)$, $WOCl_4 \cdot (DBM)$, $WOCl_4 \cdot (DEMM)$, or $WOCl_4 \cdot (DPM)$.

Exemplary ether adducts include diethyl ether ($Et_2O$) and dibutyl ether ($Bu_2O$). For example, the ether precursor may be $MoO_2Cl_2 \cdot (Et_2O)$, $MoO_2Cl_2 \cdot (Et_2O)_2$, $MoO_2Cl_2 \cdot (Bu_2O)$, $MoO_2Cl_2 \cdot (Bu_2O)_2$, $WO_2Cl_2 \cdot (Et_2O)$, $WO_2Cl_2 \cdot (Et_2O)_2$, $WO_2Cl_2 \cdot (Bu_2O)$, $WO_2Cl_2 \cdot (Bu_2O)_2$, $MoOCl_4 \cdot (Et_2O)$, $MoOCl_4 \cdot (Bu_2O)$, $WOCl_4 \cdot (Et_2O)$, or $WOCl_4 \cdot (Bu_2O)$.

Exemplary polyether adducts include ethylene glycol dibutyl ether ($^n$Bu-O—$CH_2$—$CH_2$—O-$^n$Bu or EGBE) and ethylene glycol diethyl ether (Et-O—$CH_2$—$CH_2$—O-Et or EGEE). Exemplary polyether precursors include $MoO_2Cl_2$ ($^n$Bu-O—$CH_2$—$CH_2$—O-$^n$Bu), $MoO_2Cl_2$(Et-O—$CH_2$—$CH_2$—O-Et), $WO_2Cl_2$($^n$Bu-O—$CH_2$—$CH_2$—O-$^n$Bu), $WO_2Cl_2$(Et-O—$CH_2$—$CH_2$—O-Et), $MoOCl_4$($^n$Bu-O—$CH_2$—$CH_2$—O-$^n$Bu), $MoOCl_4$(Et-O—$CH_2$—$CH_2$—O-Et), $WOCl_4$($^n$Bu-O—$CH_2$—$CH_2$—O-$^n$Bu), or $WOCl_4$(Et-O—$CH_2$—$CH_2$—O-Et).

As shown in the examples that follow, $MoO_2Cl_2$(EGBE) is particularly promising for vapor deposition technologies because it is a blue oil at room temperature and atmospheric pressure. Additionally, $MoO_2Cl_2$(EGBE) remains stable at 120° C. for over 7 hours and exhibits a vapor pressure of approximately 1.9 torr at 120° C. Vacuum TGA of $MoO_2Cl_2$(EGBE) showed a clean curve with approximately 4% residue.

Exemplary sulfide adducts include dipropyl sulfide ($Pr_2S$), 2-methyl tetrahydrothiophene (2-Me-c$SC_4H_8$), or diethyl sulfide ($Et_2S$). For example, the sulfide precursors may include $MoO_2Cl_2 \cdot (Pr_2S)_2$, $MoO_2Cl_2 \cdot (2\text{-Me-c}SC_4H_8)_2$, $MoO_2Cl_2 \cdot (Et_2S)_2$, $WO_2Cl_2 \cdot (Pr_2S)_2$, $WO_2Cl_2 \cdot (2\text{-Me-c}SC_4H_3)_2$, $WO_2Cl_2 \cdot (Et_2S)_2$, $MoOCl_4 \cdot (Pr_2S)$, $MoOCl_4 \cdot (2\text{-Me-c}SC_4H_8)$, $MoOCl_4i(Et_2S)$, $WOCl_4 \cdot (Pr_2S)$, $WOCl_4 \cdot (2\text{-Me-c}SC_4H_8)$, or $WOCl_4 \cdot (Et_2S)$.

These precursors are commercially available or may be synthesized by methods known in the art.

Both MEE'XX'$(L)_n$, and MEXX'X"X'''(L) are frequently used as catalysts. For vapor deposition, $MoO_2Cl_2$ is more volatile and thermally stable than $MoOCl_4$. However, based on the results from the ester adducts, Applicants believe that $MoO_2Cl_2$ is such a good catalyst that it may be reacting with its adducts. As a result, most of the $MoO_2Cl_2 \cdot L_n$ precursors may not improve upon the vapor deposition performance of $MoO_2Cl_2$ (although as discussed herein, there are some surprisingly good $MoO_2Cl_2 \cdot L_n$ precursors). Additionally, the adducts that work for $MoO_2Cl_2$ may not work as well for $MoOCl_4$. As a result, Applicant expects that the $MoOCl_4 \cdot L$ precursors may improve upon the vapor deposition performance of $MoOCl_4$.

Although many patent applications and journal articles have been published regarding use of the MEE'XX' or MEXX'X"X''' precursors for vapor deposition, commercial implementation currently remains elusive for a variety of reasons.

For example, any films already deposition on the substrate may be etched by any halide by-products produced during the deposition process.

Additionally, the MEE'XX' or MEXX'X"X''' precursors are solids at ambient temperature and pressure. Precursors that are solids at ambient temperature and pressure are typically not industrialized or, if they are, only for applications requiring small usage due to facilitation and process issues. Solid precursors are not preferred when a large volume of material is needed.

The reproducible and stable production of vapor from solid precursors is challenging at best. Solid precursors may be dissolved in a solvent and the solution vaporized, but the solvent may introduce impermissible contamination issues into the resulting film. Any solvent utilized cannot react with the solid precursor. Additionally, the solvent's evaporation rate cannot negatively affect the vapor pressure of the solid material. As disclosed in the file for U.S. Pat. No. 8,435,428 to Air Liquide Electronics U.S. LP, the concentration of the precursor may decrease during delivery even when the vapor pressure of the solvent and precursor are nearly identical. As a result, identification of suitable solvents for solid precursors may be difficult at best.

Alternatively, a sublimator may be used to produce vapors from the solid material directly. However, the volume of vaporized product obtained from sublimated solids remains considerably lower than that of vaporized liquids. Higher temperatures and longer processing times may also be required to obtain a sufficient amount of material needed to form the semiconductor thin film, resulting in the aforementioned facilitation and process issues. For example, any lines from the sublimator to the processing equipment may need to be heated to maintain the precursor in vapor form. And the temperature required to produce the resulting film may be too high and damage the underlying layers on the substrate. Additionally, the particle size distribution of any solid materials must be controlled to provide consistent sublimation rates and vapor pressure from batch to batch.

The sublimator transfers heat to the solid precursors unevenly, with the solid material closest to the heating source receiving more heat than solid material that is located further away from the heating source. This results in uneven heat distribution and therefore uneven vapor pressure. As a result, a large amount of solid precursor cannot typically be filled into the sublimator. Current commercial sublimator volumes range from 500 g to 1 kg. As a result, any processes using sublimated material may require the use of multiple small sublimators.

Maintaining the original solid distribution in the sublimator is also difficult. While the solid material may originally be evenly distributed in the sublimator, shipping or even connecting the sublimator to the semiconductor processing apparatus may jostle the solid materials. This also may negatively affect the sublimator's capability to produce a consistent and reproducible concentration of the vapor to a semiconductor process.

Further complicating matters, the density of purified MEE'XX' or MEXX'X"X''' precursors may vary. For example, the reported crystal density of $MoOCl_4$, $MoO_2Cl_2$, $WoO_2Cl_2$, and $WOCl_4$ at 25° C. and 1 atm pressure is 2.68 g/mL, 3.31 g/mL, 4.67 g/mL and 4.62 g/mL, respectively. However, sublimation of $MoO_2Cl_2$ and $WOCl_4$ may produce materials with varying bulk densities, including some lightweight materials having very low bulk density. Bulk density is the mass of the material divided by the total volume occupied by the material. The total volume may include the volume of the particles of the solid material, the volume of any inter-particle voids, and the volume of any internal pores. As a result, the bulk density may vary depending on how the material is handled. The purified MEE'XX' or MEXX'X"X"' precursors may have a bulk density ranging from approximately 0.3 to approximately 1.5 g/mL and typically from approximately 0.6 to approximately 1.1 g/mL.

In addition to the solid precursor complications discussed above, these low bulk density solids may become entrained in the vapor stream. Needless to say, the resulting addition of these low bulk density solid particulates to thin films is not acceptable in the semiconductor industry. Additionally, some low bulk density materials may carry an electrostatic charge. The charged materials are difficult to work with because the fly around the work area, including the inside of the glove box and the surface of any the containers. Additionally, when removed from the inert atmosphere, the flakes that escape corrode any corrosive surfaces to which they adhere.

The difficulty of handling $MoO_2Cl_2$ is well known. See, e.g., Armarego et al., Purification of Laboratory Chemicals, 2013, ISBN: 0123821614, p. 590, stating "Commercial fluffy $MoO_2Cl_2$ gives poor yields of substitution products (e.g., with $ArNHSiMe_3$), but the THF complex $MoO_2Cl_2 \cdot THF_2$ is easier to handle, reacts in a similar way, and gives much higher yields of substitution products"; and Stock et al., Advanced Synthesis and Catalysis, Vol. 354, Issue 11-12, page 2309, stating "In contrast to $MoO_2Cl_2$, which was a fluffy powder, $MoO_2Cl_2 \cdot DMF_2$ consisted visibly of crystals. For this reason, a predetermined mg-amount of $MoO_2Cl_2 \cdot DMF_2$ could be charged into a reaction flask more easily."

To overcome these challenges, Applicants have developed several methods to make the MEE'XX' or MEXX'X"X"' precursors suitable for use in vapor deposition processes. All of the disclosed processes should be performed under anhydrous and inert conditions to avoid formation of $ME_2(OH)_2$ and release of any corrosive and toxic hydrogen halide gas.

Figure 1:
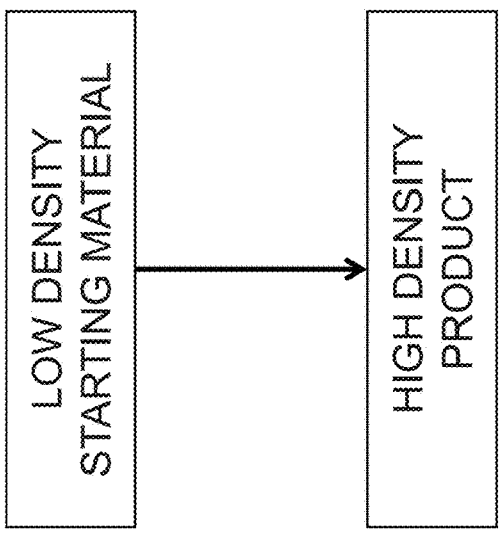
FIG. 1 is a flowchart of one of the disclosed methods to overcome some of the issues encountered in vapor deposition using solid precursors.

FIG. 1 is a flowchart illustrating one method to overcome some of the issues discussed above. More specifically, the low density MEE'XX' or MEXX'X"X"' precursors may be converted to high density MEE'XX' or MEXX'X"X"' precursors using temperature, pressure, or both. For a time ranging from approximately 1 minute to approximately 24 hours, preferably from 1 minute to 12 hours, more preferably from 1 hour to 3 hours, the MEE'XX' or MEXX'X"X"' precursors may be heated to a temperature ranging from approximately 0° C. to approximately 200° C., preferably from approximately 25° C. to approximately 150° C., and more preferably from approximately 80° C. to approximately 120° C. Alternatively, for the same time period, the MEE'XX' or MEXX'X"X"' precursors may be pressurized to a pressure ranging from approximately 1 atm to approximately 500 atm, more preferably from approximately 10 to approximately 200 atm. In another alternative, both the heating and pressurization may be performed simultaneously for the same time period. In another alternative, both the heating and pressurization may be performed sequentially for all or part of the time period. One of ordinary skill in the art will recognize the equipment needed to perform the heating and pressurization processes.

Applicants have discovered that uneven thermal treatment of the MEE'XX' or MEXX'X"X"' precursor may produce product having differing densities throughout. More particularly, uneven heating and cooling of $MoO_2Cl_2$ and $WOCl_4$ results in both a light, statically-charged flake and a dense chunky material. The statically-charged flakes are difficult to work with because they fly around the work area, including the inside of the glove box and the surface of any the containers. Additionally, when removed from the inert atmosphere, the flakes that escape corrode any corrosive surfaces to which they adhere. Finally, both the light flake and the dense chunky material still exhibit a low bulk density (e.g., ranging from approximately 0.3 to approximately 1.5 g/mL and typically from approximately 0.6 to approximately 1.1 g/mL). As a result, the sublimator contains less material and the customer requires more sublimators for any vapor deposition processes.

To overcome these issues, a pressure-resistant container of the MEE'XX' precursor is sealed and placed into an insulated atmospheric furnace. The pressure-resistant container may be made from any non-corrosive materials, such as glass, halide resistant stainless steel, PTFE, etc. The furnace may be set to slightly above the melting point of the MEE'XX' or MEXX'X"X"' precursor. For $MoO_2Cl_2$, the furnace is set to a temperature ranging from approximately 185° C. to approximately 205° C. The container may be placed into the furnace before heating or into a pre-heated furnace. The container is heated for a time period sufficient to melt the MEE'XX' or MEXX'X"X"' precursor. One of ordinary skill in the art will recognize that this time will vary depending on the temperature of the furnace and the quantity of MEE'XX' or MEXX'X"X"' precursor, After melting, the furnace is turned off. The container evenly cools to room temperature inside the insulated furnace. One of ordinary skill in the art will recognize that the amount of time to cool the container will also depend upon the quantity of MEE'XX' or MEXX'X"X"' precursor.

The resulting high density materials have a density ranging from approximately 1.0 g/mL to the reported crystal density at room temperature and atmospheric pressure, preferably from approximately 1.9 g/mL to the reported crystal density. The high density materials are less likely to become entrained in the vapor phase. Additionally, the high density materials are more compact and less likely to be disturbed after packing in the sublimator. Finally, the high density material results in a larger volume in each sublimator and less separate sublimator canisters for the customer.

Figure 2:
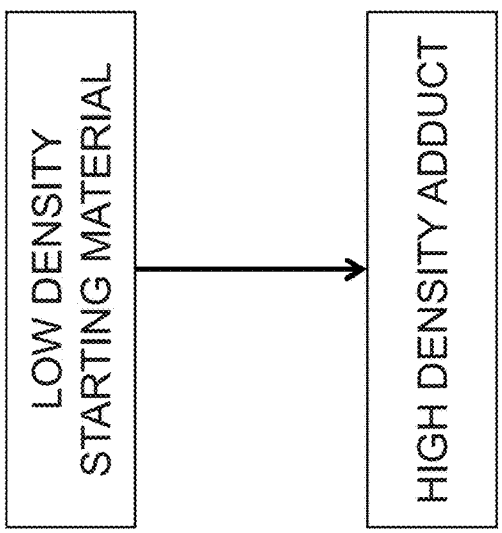
FIG. 2 is a flowchart of one of the disclosed methods to overcome some of the issues encountered in vapor deposition using solid precursors.

Alternatively, the process described in the flowchart of FIG. 2 may be used to overcome the issues discussed above regarding vapor deposition using solid precursors. More specifically, the low density MEE'XX' or MEXX'X"X"' precursors may be converted to high density adducts by reacting the MEE'XX' or MEXX'X"X"' precursors with a coordinating ligand. The resulting adducts have the formula MEE'XX'·$L_n$ or MEXX'X"X"'·L, disclosed above. As shown in more detail in the examples that follow, 1 molar equivalent of the low density MEE'XX' or MEXX'X"X"' precursor is reacted with 0.1 or more molar equivalents of ligand L with or without a solvent at a temperature ranging from approximately −50° C. to approximately 100° C. Suitable solvents include hydrocarbons, halogenated hydrocarbons, ethers, nitriles, ketones, or combinations thereof. The order of addition is not important. In other words, the low density MEE'XX' or MEXX'X"X"' precursors may be added to the ligand L or the ligand L may be added to the MEE'XX' or MEXX'X"X'" precursor. The combination is maintained for approximately 0.1 hours to approximately 48 hours with or without stirring. One of ordinary skill in the art will recognize the equipment needed to perform the mixing process.

As discussed above, $MoO_2Cl_2$ is very difficult to handle. For large scale processes, it may be beneficial to utilize a tetrahydrofuran (THF) adduct/solvent to produce a liquid solution of $MoO_2Cl_2 \cdot THF_2$. The THF adduct may then be replaced by the desired adduct. The replacement adduct must be more coordinating than the THF adduct in order to be suitable for replacement. For example, the nitriles may not be successful in this synthesis method for $MoO_2Cl_2 \cdot L_n$ because it will not displace THF, Applicants believe that chelating adducts, such as amides, diamides, esters, or anhydrides, may be suitable to displace THF using this synthesis method.

The resulting high density adducts have a density ranging from approximately 1.5 g/mL to approximately 4.0 g/mL at room temperature and atmospheric pressure. Some of the resulting high density adducts may even be in liquid form at room temperature and atmospheric pressure. As discussed above, liquid precursors are more suitable than solid precursors for commercial vapor deposition techniques. For example, canisters of liquid precursors may be easily filled using liquid transfer techniques. The high density adducts are less likely to become entrained in the vapor phase. Additionally, the high density adducts are more compact and less likely to be jostled after packing in the sublimator. Finally, the higher density precursors are easier to handle than lower density precursor and may permit an increased load per volume.

Applicants expect that the M-L bonds will break at the deposition temperature. As a result, no film contamination is expected from inclusion of the adduct in the MEE'XX'·$L_n$ or MEXX'X"X'"·L precursors. As such, these precursors should behave as MEE'XX' or MEXX'X"X'", but be easier to handle and use owing to their lower melting point. The disclosed MEE'XX'·$L_n$ or MEXX'X"X'"·L precursors may also be better than MEE'XX' or MEXX'X"X'" due to a lower deposition temperature and reduced etching effect due to any deposition by-products.

Finally, Applicants believe that the disclosed MEE'XX'L or MEXX'X"X'"·L precursors may be more stable and less hydrolysable than the MEE'XX' or MEXX'X"X'" precursors. The disclosed MEE'XX'·$L_n$ or MEXX'X"X'"·L precursors may also exhibit less etching damage to the substrate and reactor than the MEE'XX' or MEXX'X"X'" precursors. This may be demonstrated by comparative deposition testing. More particularly, a thicker combination of the substrate and deposited film from the adducted precursors as compared to the non-adducted analogs may demonstrate reduced etching damage. Applicants believe that the adducted precursors may increase the thickness of the substrate and deposited film by approximately 0% to approximately 25% as compared to the non-adducted analogs.

In another alternative, the process disclosed in the flowchart of FIG. 3 may be used to overcome the issues discussed above regarding vapor deposition using solid precursors. More particularly, the low density MEE'XX' or MEXX'X"X'" precursors may be converted to low density adducts and the low density adducts converted to high density adducts by following the processes in the flow chart of FIG. 2 prior to performing the processes in the flow chart of FIG. 1. Applicants have discovered that several of the MEE'XX'·$L_n$ or MEXX'X"X'"·L precursors, such as L=THF or isovaleronitrile, are solids that exhibit low bulk density (e.g., ranging from approximately 0.3 to approximately 1.5 g/mL and typically from approximately 0.6 to approximately 1.1 g/mL). As a result, the combination of the flow charts of FIGS. 1 and 2 may provide high density materials having a density ranging from approximately 1.0 g/mL to the reported crystal density at room temperature and atmospheric pressure, preferably from approximately 1.9 g/mL to the reported crystal density. The high density materials are less likely to become entrained in the vapor phase. Additionally, the high density materials are more compact and less likely to be disturbed after packing in the sublimator. Finally, the high density material results in a larger volume in each sublimator and less separate sublimator canisters for the customer.

Figure 4:
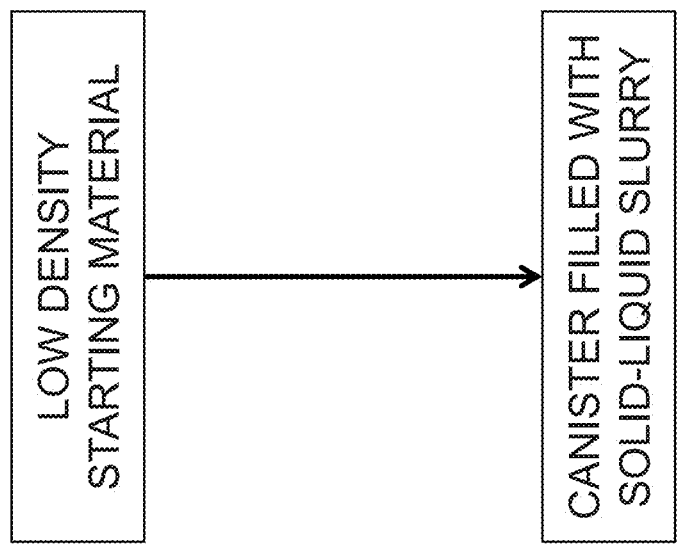
FIG. 4 is a flowchart of one of the disclosed methods to overcome some of the issues encountered in vapor deposition using solid precursors.

In another alternative, the process disclosed in the flowchart of FIG. 4 may be used to overcome the issues discussed above regarding vapor deposition using solid precursors. More particularly, the low density MEE'XX' or MEXX'X"X'" precursors may be mixed with an unreactive and non-volatile liquid to form a slurry. Approximately 1% w/w to approximately 99% w/w of the low density MEE'XX' or MEXX'X"X'" precursor is added to the unreactive and non-volatile liquid at a temperature ranging from approximately −80° C. to approximately 250° C., preferably from approximately −50° C. to approximately 100° C., more preferably from approximately room temperature to approximately 50° C. The order of addition is not important. In other words, the low density MEE'XX' or MEXX'X"X'" precursors may be added to the unreactive and non-volatile liquid or the unreactive and non-volatile liquid may be added to the low density MEE'XX', or MEXX'X"X'" precursor. Exemplary unreactive and non-volatile liquids preferably have boiling points above 200° C. and exhibit a vapor pressure that is 0% to approximately 1% of the vapor pressure of the precursor. Exemplary unreactive and non-volatile liquids include include silicone oils, hydrocarbons, perfluorinated polyethers, and combinations thereof. The combination is maintained with or without stirring until homogenous. Typically, the combination is maintained between approximately 0.1 hours to approximately 48 hours, and more preferably from approximately 0.5 hours to approximately 8 hours. One of ordinary skill in the art will recognize the equipment needed to perform the mixing process. One of ordinary skill in the art will further recognize that mixing time will depend on the size of the batch and that homogeneity will take longer for non-stirred mixtures than for stirred mixtures.

The slurries permit easier filling of and more efficient heat transfer through the canister. The slurries are less likely to become entrained in the vapor phase. Additionally, the slurries are more compact and less likely to be jostled after packing in the sublimator.

Figure 5:
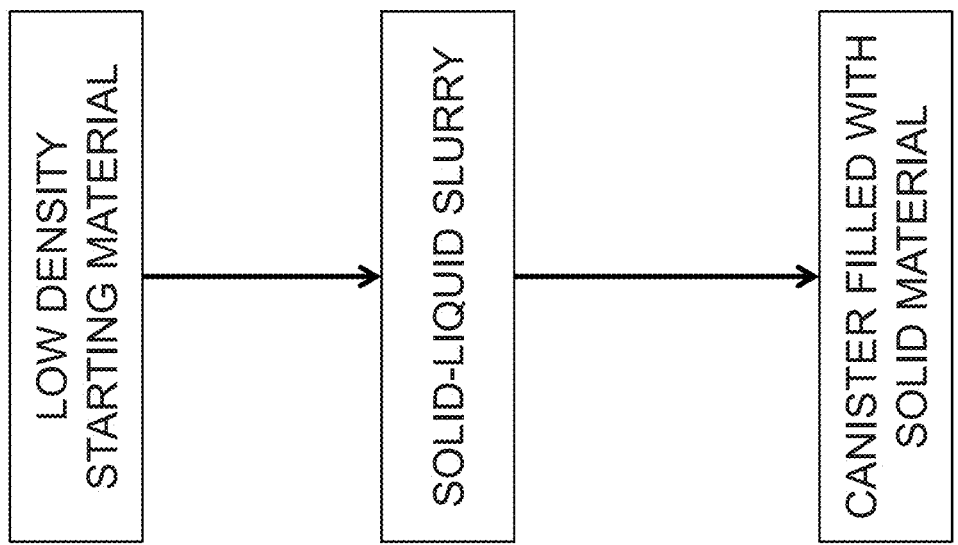
FIG. 5 is a flowchart of one of the disclosed methods to overcome some of the issues encountered in vapor deposition using solid precursors.

In another alternative, the flowchart of FIG. 5 may be used to overcome the issues discussed above regarding vapor deposition using solid precursors. More particularly, the low density MEE'XX' or MEXX'X"X'" precursors may be mixed with an inert volatile liquid to form a solid-liquid slurry. The slurry may be transferred to the sublimator and the volatile liquid removed to form a solid cake of the high density MEE'XX' or MEXX'X"X'" precursor. Approximately 1% w/w to approximately 75% w/w of the low density MEE'XX' or MEXX'X"X'" precursor is added to the inert volatile liquid at a temperature ranging from approximately −50° C. to approximately 100° C. The order of addition is not important. In other words, the low density MEE'XX' or MEXX'X"X'" precursors may be added to the inert volatile liquid or the inert volatile liquid may be added to the low density MEE'XX', or MEXX'X"X'" precursor. Exemplary inert volatile liquids include alkanes, such as pentane, hexane, or cyclohexane, or chlorinated solvents, such as $SiCl_4$, DCM or chloroform. The combination is maintained with or without stirring until homogenous. Typically, the combination is maintained between approximately X hours to approximately 48 hours, and more preferably from approximately X hours to approximately 8 hours. One of ordinary skill in the art will recognize the equipment needed to perform the mixing process. One of ordinary skill in the art will further recognize that mixing time will depend on the size of the batch and that homogeneity will take longer for non-stirred mixtures than for stirred mixtures.

The resulting high density materials have a density ranging from approximately 1.0 g/mL to the reported crystal density at room temperature and atmospheric pressure. The high density materials are less likely to become entrained in the vapor phase. Additionally, the high density materials are more compact and less likely to be jostled after packing in the sublimator.

Applicants believe that the disclosed Group 6 transition metal-containing film forming compositions treated by the processes of FIGS. 1-5 may be suitable for use in commercial vapor deposition processes. More particularly, the resulting Group 6 transition metal-containing film forming compositions may have higher volatility and lower melting points than the analogous non-treated composition. As shown in the examples that follow, the proposed treatments may convert some of the pretreated compounds into a liquid, which is more commercially viable than solids for vapor deposition processes. The treatments may also increase the stability of the Group 6 transition metal-containing film forming compositions and/or increase the compositions reactivity to any vapor deposition reactants as compared to the non-treated analog. The treatments may also reduce etching of any halide-sensitive substrates during the vapor deposition process. The adducts may also permit improved area selective deposition.

Methods of purifying the MEE'XX' or MEXX'X"X''' precursors are also disclosed. Any of the coordinating ligands disclosed above reacts with the MEE'XX' or MEXX'X"X''' precursors to form an adduct of the general formula MEE'XX'·$L_n$ or MEXX'X"X'''·L with M=Mo, W; E=O, S; X=Cl, Br, I; n=1, 2. The adduct is heated to moderate temperatures (ranging from approximately 50° C. to approximately 300° C.) in a sublimation or distillation process to produce a purified adduct. Subsequent treatment of the purified adduct reverts the coordination process leading to a purified MEE'XX' or MEXX'X"X'''. Exemplary subsequent treatments include high temperature (ranging from approximately 300° C. to approximately 500° C., pH change, low pressure (ranging from approximately 0 to approximately 1 Torr), ligand oxidation, photochemical, or electrochemical. Applicants believe the purified MEE'XX' or MEXX'X"X''' will contain less impurities than the starting MEE'XX' or MEXX'X"X'''.

Any of the disclosed Group 6 transition metal-containing film forming compositions may exhibit (i) sufficient volatility to provide a rapid and reproducible delivery into the reaction chamber from the vessel in which they are stored, (ii) high thermal stability to avoid decomposition during the storage in the canister and to enable self-limiting growth in ALD mode at high temperature, typically >150° C. for dielectric films and >275° C. for conductive films, (iii) appropriate reactivity toward the substrate terminal functions and with the reacting gas to an easy conversion into the desired film, and (iv) high purity to obtain a film with low impurities.

Purity of the disclosed Group 6 transition metal-containing film forming compositions is preferably higher than 99.9% w/w. The disclosed Group 6 transition metal-containing film forming compositions may contain any of the following impurities: Mo(=NR)Cl(OR), wherein R is defined as above, alkylamines, dialkylamines, alkylimines, alkoxies, THF, ether, toluene, chlorinated metal compounds, lithium or sodium alkoxy, or lithium or sodium amide. Preferably, the total quantity of these impurities is below 0.1% w/w. The purified product may be produced by sublimation, distillation, and/or passing the gas or liquid through a suitable adsorbent, such as a 4A molecular sieve. For example The MEE'XX'·$L_n$ or MEXX'X"X'''·L precursors may be purified by heating to a temperature ranging from approximately 75° C. to approximately 300° C., preferably from approximately 100° C. to approximately 200° C., at a pressure ranging from approximately 1 mTorr to approximately 500 Torr, preferably from 1 Torr to 200 Torr.

The disclosed Group 6 transition metal-containing film forming compositions may also include metal impurities at the ppbw (part per billion weight) level. These metal impurities include, but are not limited to, Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Gallium (Ga), Germanium (Ge), Hafnium (Hf), Zirconium (Zr), Indium (In), Iron (Fe), Lead (Pb), Lithium (Li), Magnesium (Mg), Manganese (Mn), Tungsten (W), Nickel (Ni), Potassium (K), Sodium (Na), Strontium (Sr), Thorium (Th), Tin (Sn), Titanium (Ti), Tungsten (W), Uranium (U), Vanadium (V), and Zinc (Zn). The Group 6 transition metal-containing film forming compositions comprise between approximately 0 ppb and approximately 10,000 ppb, preferably between approximately 0 ppb and approximately 1,000 ppb, and more preferably between approximately 0 ppb and approximately 500 ppb of any one of these metal impurities.

Also disclosed are methods for forming Group 6 transition metal-containing layers on a substrate using a vapor deposition process. The method may be useful in the manufacture of semiconductor, photovoltaic, LCD-TFT, or flat panel type devices. The disclosed Group 6 transition metal-containing film forming compositions may be used to deposit thin Group 6 transition metal-containing films using any vapor deposition methods known to those of skill in the art, such as Atomic Layer Deposition or Chemical Vapor Deposition. Exemplary CVD methods include thermal CVD, plasma enhanced CVD (PECVD), pulsed CVD (PCVD), low pressure CVD (LPCVD), sub-atmospheric CVD (SACVD) or atmospheric pressure CVD (APCVD), hot-wire CVD (HWCVD, also known as cat-CVD, in which a hot wire serves as an energy source for the deposition process), radicals incorporated CVD, and combinations thereof. Exemplary ALD methods include thermal ALD, plasma enhanced ALD (PEALD), spatial isolation ALD, hot-wire ALD (HWALD), radicals incorporated ALD, and combinations thereof. Super critical fluid deposition may also be used. The deposition method is preferably ALD, PE-ALD, or spatial ALD in order to provide suitable step coverage and film thickness control.

FIG. 6 is a block diagram that schematically illustrates an example of a vapor deposition apparatus that may be used to form the Group 6 transition metal-containing layer. The apparatus illustrated in FIG. 6 includes a reactor 11, a feed source 12 for the disclosed Group 6 transition metal-containing film forming compositions, a feed source 13 for reactant (typically, an oxidizing agent such as oxygen or ozone), and a feed source 14 for an inert gas that can be used as a carrier gas and/or dilution gas, A substrate loading and unloading mechanism (not shown) allows the insertion and removal of deposition substrates in the reactor 11. A heating device (not shown) is provided to reach the reaction temperatures required for reaction of the disclosed compositions.

The Group 6 transition metal-containing film forming compositions feed source 12 may use a bubbler method to introduce the composition into the reactor 11, and is connected to the inert gas feed source 14 by the line L1. The line L1 is provided with a shutoff valve V1 and a flow rate controller, for example, a mass flow controller MFC1, downstream from this valve. The composition is introduced from its feed source 12 through the line L2 into the reactor 11. The following are provided on the upstream side: a pressure gauge PG1, a shutoff valve V2, and a shutoff valve V3.

The reactant feed source 13 comprises a vessel that holds the reactant in gaseous, liquid, or solid form. Vapors of the reactant are introduced from its feed source 13 through the line L3 into the reactor 11. A shutoff valve V4 is provided in the line L3. This line L3 is connected to the line L2.

The inert gas feed source 14 comprises a vessel that holds inert gas in gaseous form. The inert gas can be introduced from its feed source through the line L4 Into the reactor 11. Line L4 is provided with the following on the upstream side: a shutoff valve V6, a mass flow controller MFC3, and a pressure gauge PG2. The line L4 joins with the line L3 upstream from the shutoff valve V4.

The line L5 branches off upstream from the shutoff valve V1 in the line L1; this line L5 joins the line L2 between the shutoff valve V2 and the shutoff valve V3. The line L5 is provided with a shutoff valve V7 and a mass flow controller MFC4 considered from the upstream side.

The line L6 branches off between the shutoff valves V3 and V4 into the reaction chamber 11. This line L6 is provided with a shutoff valve V8.

A line L7 that reaches to the pump PMP is provided at the bottom of the reactor 11. This line L7 contains the following on the upstream side; a pressure gauge PG3, a butterfly valve BV for controlling the backpressure, and a cold trap 15. This cold trap 15 comprises a tube (not shown) that is provided with a cooler (not shown) over Its circumference and is aimed at collecting the tungsten precursor and the related by-products.

The reactor may be any enclosure or chamber within a device in which deposition methods take place such as without limitation, a parallel-plate type reactor, a cold-wall type reactor, a hot-wall type reactor, a single-wafer reactor, a multi-wafer reactor, or other types of deposition systems under conditions suitable to cause the compounds to react and form the layers.

The reactor contains one or multiple substrates onto which the films will be deposited. A substrate is generally defined as the material on which a process is conducted. The substrates may be any suitable substrate used in semiconductor, photovoltaic, flat panel, or LCD-TFT device manufacturing. Examples of suitable substrates include wafers, such as silicon, silica, glass, or GaAs wafers. The wafer may have one or more layers of differing materials deposited on it from a previous manufacturing step. For example, the wafers may include silicon layers (crystalline, amorphous, porous, etc.), silicon oxide layers, silicon nitride layers, silicon oxy nitride layers, carbon doped silicon oxide (Si-COH) layers, or combinations thereof. Additionally, wafers may include copper layers or noble metal layers (e.g. platinum, palladium, rhodium, or gold). The wafers may include barrier layers, such as manganese, manganese oxide, etc. Plastic layers, such as poly(3,4-ethylenedioxythiophene)poly (styrenesulfonate) [PEDOT:PSS] may also be used. The layers may be planar or patterned. The disclosed processes may deposit the Group 6 transition metal-containing layer directly on the wafer or directly on one or more than one (when patterned layers form the substrate) of the layers on top of the wafer. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. For example, a molybdenum oxide film may be deposited onto a TiN layer. In subsequent processing, a zirconium oxide layer may be deposited on the molybdenum layer, a second molybdenum layer may be deposited on the zirconium oxide layer, and a TiN layer may be deposited on the second molybdenum layer, forming a TiN/MoO$_x$/ZrO$_2$/MoO$_x$/TiN stack, with x ranging from 2-3 inclusively, used in DRAM capacitors.

The temperature and the pressure within the reactor are held at conditions suitable for vapor depositions. In other words, after introduction of the vaporized composition into the chamber, conditions within the chamber are such that at least part of the vaporized precursor is deposited onto the substrate to form a Group 6 transition metal-containing film. For instance, the pressure in the reactor may be held between about 1 Pa and about $10^5$ Pa, more preferably between about 25 Pa and about $10^3$ Pa, as required per the deposition parameters. Likewise, the temperature in the reactor may be held between about 100° C. and about 500° C. preferably between about 150° C. and about 400° C. One of ordinary skill in the art will recognize that "at least part of the vaporized precursor is deposited" means that some or all of the precursor reacts with or adheres to the substrate.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 100° C. to approximately 500° C. When a plasma deposition process is utilized, the deposition temperature may range from approximately 150° C. to approximately 400° C. Alternatively, when a thermal process is performed, the deposition temperature may range from approximately 200° C. to approximately 500° C.

The disclosed Group 6 transition metal-containing film forming compositions may be supplied either in neat form or in a blend with a suitable solvent, such as ethyl benzene, xylene, mesitylene, decane, dodecane. The disclosed compositions may be present in varying concentrations in the solvent.

The neat or blended Group 6 transition metal-containing film forming compositions are introduced into a reactor in vapor form by conventional means, such as tubing and/or flow meters. The compound in vapor form may be produced by vaporizing the neat or blended compound solution through a conventional vaporization step such as direct vaporization, distillation, or by bubbling, or by using a sublimator such as the one disclosed in PCT Publication WO2009/087609 to Xu et al. The neat or blended composition may be fed in liquid state to a vaporizer where it is vaporized before it is introduced into the reactor. Alternatively, the neat or blended composition may be vaporized by passing a carrier gas into a container containing the composition or by bubbling the carrier gas into the composition. The carrier gas may include, but is not limited to, Ar, He, $N_2$, and mixtures thereof. Bubbling with a carrier gas may also remove any dissolved oxygen present in the neat or blended composition. The carrier gas and composition are then introduced into the reactor as a vapor.

If necessary, the container of disclosed compositions may be heated to a temperature that permits the composition to be in its liquid phase and to have a sufficient vapor pressure. The container may be maintained at temperatures in the range of, for example, approximately 0° C. to approximately 150° C. Those skilled in the art recognize that the temperature of the container may be adjusted in a known manner to control the amount of composition vaporized.

Figure 29:
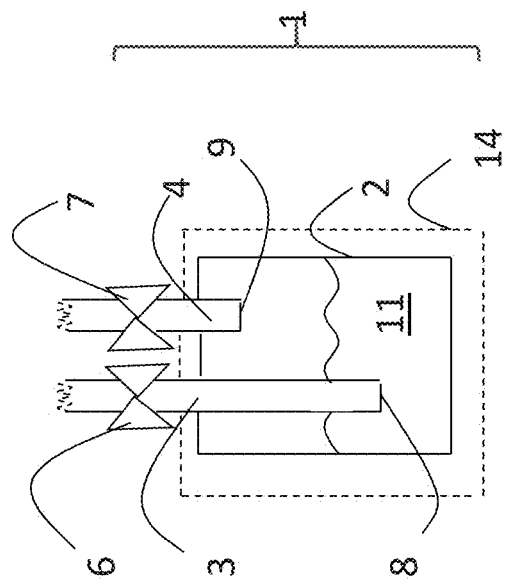
FIG. 29 is a side view of a second embodiment of the Group 6 transition metal-containing film forming compositions delivery device 1.
Figure 28:
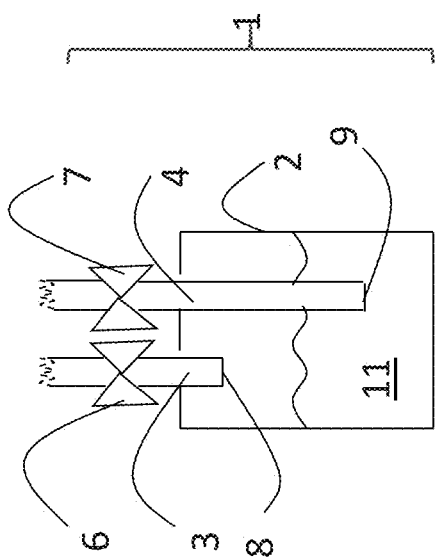
FIG. 28 is a side view of one embodiment of a liquid Group 6 transition metal-containing film forming compositions delivery device 1.

The Group 6 transition metal-containing film forming compositions may be delivered to a semiconductor processing tool by the disclosed Group 6 transition metal-containing film forming composition delivery devices. FIGS. 28 and 29 show two embodiments of the disclosed delivery devices 1.

FIG. 28 is a side view of one embodiment of the Group 6 transition metal-containing film forming composition delivery device 1. In FIG. 28, the disclosed Group 6 transition metal-containing film forming composition 11 is contained within a container 2 having at least two conduits, an inlet conduit 3 and an outlet conduit 4. One of ordinary skill in the precursor art will recognize that the container 2, inlet conduit 3, and outlet conduit 4 are manufactured to prevent the escape of the gaseous form of the Group 6 transition metal-containing film forming composition 11, even at elevated temperature and pressure.

Suitable valves include spring-loaded or tied diaphragm valves. The valve may further comprise a restrictive flow orifice (RFO). The delivery device 1 should be connected to a gas manifold and in an enclosure. The gas manifold should permit the safe evacuation and purging of the piping that may be exposed to air when the delivery device 1 is replaced so that any residual amount of the material does not react.

The delivery device 1 must be leak tight and be equipped with valves that do not permit escape of even minute amounts of the material when closed. The delivery device 1 fluidly connects to other components of the semiconductor processing tool, such as the gas cabinet disclosed above, via valves 6 and 7. Preferably, the container 2, inlet conduit 3, valve 6, outlet conduit 4, and valve 7 are typically made of 316L EP stainless steel.

In FIG. 28, the end 8 of inlet conduit 3 is located above the surface of the Group 6 transition metal-containing film forming composition 11, whereas the end 9 of the outlet conduit 4 is located below the surface of the Group 6 transition metal-containing film forming composition 11. In this embodiment, the Group 6 transition metal-containing film forming composition 11 is preferably in liquid form. An inert gas, including but not limited to nitrogen, argon, helium, and mixtures thereof, may be introduced into the inlet conduit 3. The inert gas pressurizes the container 2 so that the liquid Group 6 transition metal-containing film forming composition 11 is forced through the outlet conduit 4 and to components in the semiconductor processing tool (not shown). The semiconductor processing tool may include a vaporizer which transforms the liquid Group 6 transition metal-containing film forming composition 11 into a vapor, with or without the use of a carrier gas such as helium, argon, nitrogen or mixtures thereof, in order to deliver the vapor to a chamber where a wafer to be repaired is located and treatment occurs in the vapor phase. Alternatively, the liquid Group 6 transition metal-containing film forming composition 11 may be delivered directly to the wafer surface as a jet or aerosol.

FIG. 29 is a side view of a second embodiment of the Group 6 transition metal-containing film forming composition delivery device 1. In FIG. 29, the end 8 of inlet conduit 3 is located below the surface of the Group 6 transition metal-containing film forming composition 11, whereas the end 9 of the outlet conduit 4 is located above the surface of the Group 6 transition metal-containing film forming composition 11. FIG. 29 also includes an optional heating element 14, which may increase the temperature of the Group 6 transition metal-containing film forming composition 11. The Group 6 transition metal-containing film forming composition 11 may be in solid or liquid form. An inert gas, including but not limited to nitrogen, argon, helium, and mixtures thereof, is introduced into the inlet conduit 3. The inert gas flows through the Group 6 transition metal-containing film forming composition 11 and carries a mixture of the inert gas and vaporized Group 6 transition metal-containing film forming composition 11 to the outlet conduit 4 and to the components in the semiconductor processing tool.

Both FIGS. 28 and 29 include valves 6 and 7. One of ordinary skill in the art will recognize that valves 6 and 7 may be placed in an open or closed position to allow flow through conduits 3 and 4, respectively. In another alternative, the inlet conduit 3 and outlet conduit 4 may both be located above the surface of the Group 6 transition metal-containing film forming composition 11 without departing from the disclosure herein. Furthermore, inlet conduit 3 may be a filling port.

In another alternative, either delivery device 1 in FIG. 28 or 29, or a simpler delivery device having a single conduit terminating above the surface of any solid or liquid present, may be used if the Group 6 transition metal-containing film forming composition 11 is in vapor form or if sufficient vapor pressure is present above the solid/liquid phase. In this case, the Group 6 transition metal-containing film forming composition 11 is delivered in vapor form through the conduit 3 or 4 simply by opening the valve 6 in FIG. 28 or 7 in FIG. 29, respectively. The delivery device 1 may be maintained at a suitable temperature to provide sufficient vapor pressure for the Group 6 transition metal-containing film forming composition 11 to be delivered in vapor form, for example by the use of an optional heating element 14.

Figure 30:
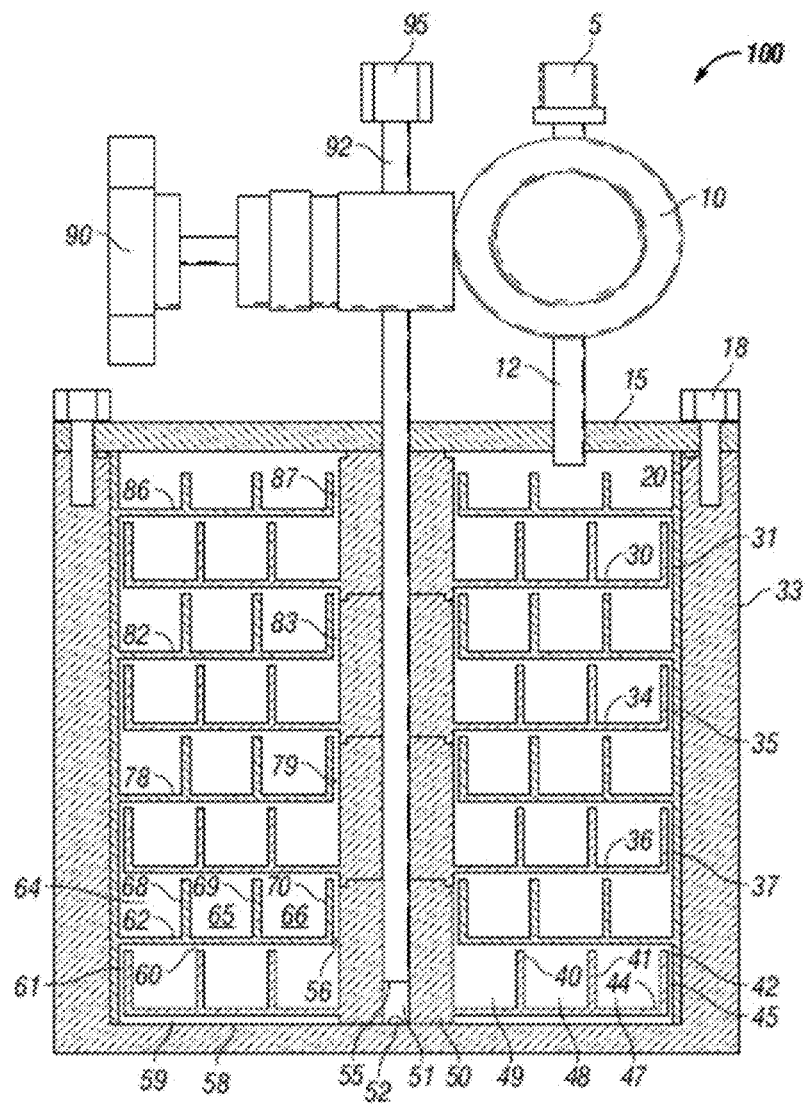
FIG. 30 is an exemplary embodiment of a solid precursor sublimator 100 for subliming solid Group 6 transition metal-containing film forming compositions.

When the Group 6 transition metal-containing film forming compositions are solids, their vapors may be delivered to the reactor using a sublimator. FIG. 30 shows one embodiment of a suitable sublimator 100. The sublimator 100 comprises a container 33. Container 33 may be a cylindrical container, or alternatively, may be any shape, without limitation. The container 33 is constructed of materials such as stainless steel, nickel and its alloys, quartz, glass, and other chemically compatible materials, without limitation. In certain instances, the container 33 is constructed of another metal or metal alloy, without limitation. In certain instances, the container 33 has an internal diameter from about 8 centimeters to about 55 centimeters and, alternatively, an internal diameter from about 8 centimeters to about 30 centimeters. As understood by one skilled in the art, alternate configurations may have different dimensions.

Container 33 comprises a sealable top 15, sealing member 18, and gasket 20. Sealable top 15 is configured to seal container 33 from the outer environment. Sealable top 15 is configured to allow access to the container 33. Additionally, sealable top 15 is configured for passage of conduits into container 33. Alternatively, sealable top 15 is configured to permit fluid flow into container 33. Sealable top 15 is configured to receive and pass through a conduit comprising a dip tube 92 to remain in fluid contact with container 33. Dip tube 92 having a control valve 90 and a fitting 95 is configured for flowing carrier gas into container 33. In certain instances, dip tube 92 extends down the center axis of container 33. Further, sealable top 15 is configured to receive and pass through a conduit comprising outlet tube 12. The carrier gas and vapor of the Group 6 transition metal-containing film forming composition is removed from container 33 through the outlet tube 12. Outlet tube 12 comprises a control valve 10 and fitting 5. In certain instances, outlet tube 12 is fluidly coupled to a gas delivery manifold, for conducting carrier gas from the sublimator 100 to a film deposition chamber.

Container 33 and sealable top 15 are sealed by at least two sealing members 18; alternatively, by at least about four sealing members. In certain instance, sealable top 15 is sealed to container 33 by at least about eight sealing members 18. As understood by one skilled in the art, sealing member 18 releasably couples sealable top 15 to container 33, and forms a gas resistant seal with gasket 20. Sealing member 18 may comprise any suitable means known to one skilled in the art for sealing container 33. In certain instances, sealing member 18 comprises a thumbscrew.

As illustrated in FIG. 30, container 33 further comprises at least one disk disposed therein. The disk comprises a shelf, or horizontal support, for solid material. In certain embodiments, an interior disk 30 is disposed annularly within the container 33, such that the disk 30 includes an outer diameter or circumference that is less than the inner diameter or circumference of the container 33, forming an opening 31. An exterior disk 86 is disposed circumferentially within the container 33, such that the disk 86 comprises an outer diameter or circumference that is the same, about the same, or generally coincides with the inner diameter of the container 33. Exterior disk 86 forms an opening 87 disposed at the center of the disk. A plurality of disks is disposed within container 33. The disks are stacked in an alternating fashion, wherein interior disks 30, 34, 36, 44 are vertically stacked within the container with alternating exterior disks 62, 78, 82, 86. In embodiments, interior disks 30, 34, 36, 44 extend annularly outward, and exterior disks 62, 78, 82, 86 extend annularly toward the center of container 33. As illustrated in the embodiment of FIG. 30, interior disks 30, 34, 36, 44 are not in physical contact with exterior disks 62, 78, 82, 86.

The assembled sublimator 100 comprises interior disks 30, 34, 36, 44 comprising aligned and coupled support legs 50, interior passage 51, concentric walls 40, 41, 42, and concentric slots 47, 48, 49. The interior disks 30, 34, 36, 44 are vertically stacked, and annularly oriented about the dip tube 92. Additionally, the sublimator comprises exterior disks 62, 78, 82, 86. As illustrated in FIG. 30, the exterior disks 62, 78, 82, 86 should be tightly fit into the container 33 for a good contact for conducting heat from the container 33 to the disks 62, 78, 82, 86. Preferably, the exterior disks 62, 78, 82, 86 are coupled to, or in physical contact with, the inner wall of the container 33.

As illustrated, exterior disks 62, 78, 82, 86 and interior disks 30, 34, 36, 44 are stacked inside the container 33. When assembled in container 33 to form sublimator 100, the interior disks 30, 34, 36, 44 form outer gas passages 31, 35, 37, 45 between the assembled exterior disks 62, 78, 82, 86. Further, exterior disks 62, 78, 82, 86 form inner gas passages 56, 79, 83, 87 with the support legs of the interior disks 30, 34, 36, 44. The walls 40, 41, 42 of interior disks 30, 34, 36, 44 form the grooved slots for holding solid precursors. Exterior disks 62, 78, 82, 86 comprise walls 68, 69, 70 for holding solid precursors. During assembly, the solid precursors are loaded into the annular slots 47, 48, 49 of interior disks 30, 34, 36, 44 and annular slots 64, 65, 66 of exterior disks 62, 78, 82, 86.

While FIG. 30 discloses one embodiment of a sublimator capable of delivering the vapor of any solid Group 6 transition metal-containing film forming composition to the reactor, one of ordinary skill in the art will recognize that other sublimator designs may also be suitable, without departing from the teachings herein. Finally, one of ordinary skill in the art will recognize that the disclosed Group 6 transition metal-containing film forming composition 11 may be delivered to semiconductor processing tools using other delivery devices, such as the ampoules disclosed in WO 2006/059187 to Jurcik et al., without departing from the teachings herein.

In addition to the disclosed compositions, a reactant may also be introduced into the reactor. The reactant may be an oxidizing gas such as one of $O_2$, $O_3$, $H_2O$, $H_2O_2$, NO, $N_2O$, $NO_2$, oxygen containing radicals such as O· or OH·, NO, $NO_2$, carboxylic acids, formic acid, acetic acid, propionic acid, and mixtures thereof. Preferably, the oxidizing gas is selected from the group consisting of $O_2$, $O_3$, $H_2O$, $H_2O_2$, oxygen containing radicals thereof such as O· or OH·, and mixtures thereof.

Alternatively, the reactant may be a reducing gas such as one of $H_2$, $H_2CO$, $NH_3$, $SiH_4$, $Si_2H_6$, $Si_3H_8$, $(CH_3)_2SiH_2$, $(C_2H_5)_2SiH_2$, $(CH_3)SiH_3$, $(C_2H_5)SiH_3$, phenyl silane, $N_2H_4$, $N(SiH_3)_3$, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$, $(CH_3)HNNH_2$, $(CH_3)_2NNH_2$, phenyl hydrazine, $H_2N-C_2H_4-NH_2$, substituted ethylene diamine, N-containing molecules, $B_2H_6$, 9-borabicyclo[3,3,1]nonane, dihydrobenzenfuran, pyrazoline, trimethylaluminium, dimethylzinc, diethylzinc, radical species thereof, and mixtures thereof. Preferably, the reducing gas is $H_2$, $NH_3$, $SiH_4$, $Si_2H_6$, $Si_3H_8$, $SiH_2Me_2$, $SiH_2Et_2$, $N(SiH_3)_3$, $H_2N-C_2H_4-NH_2$, hydrogen radicals thereof, or mixtures thereof. More preferably, the reducing gas is $H_2N-C_2H_4-NH_2$.

The reactant may be treated by a plasma, in order to decompose the reactant into its radical form. $N_2$ may also be utilized as a reducing gas when treated with plasma. For instance, the plasma may be generated with a power ranging from about 50 W to about 500 W, preferably from about 100 W to about 400 W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

For example, the reactant may be introduced into a direct plasma reactor, which generates plasma in the reaction chamber, to produce the plasma-treated reactant in the reaction chamber. Exemplary direct plasma reactors include the Titan™ PECVD System produced by Trion Technologies. The reactant may be introduced and held in the reaction chamber prior to plasma processing. Alternatively, the plasma processing may occur simultaneously with the introduction of the reactant. In-situ plasma is typically a 13.56 MHz RF inductively coupled plasma that is generated between the showerhead and the substrate holder. The substrate or the showerhead may be the powered electrode depending on whether positive ion impact occurs. Typical applied powers in in-situ plasma generators are from approximately 30 W to approximately 1000 W. Preferably, powers from approximately 30 W to approximately 600 W are used in the disclosed methods. More preferably, the powers range from approximately 100 W to approximately 500 W. The disassociation of the reactant using in-situ plasma is typically less than achieved using a remote plasma source for the same power input and is therefore not as efficient in reactant disassociation as a remote plasma system, which may be beneficial for the deposition of Group 6 transition metal-containing films on substrates easily damaged by plasma.

Alternatively, the plasma-treated reactant may be produced outside of the reaction chamber. The MKS Instruments' ASTRONi® reactive gas generator may be used to treat the reactant prior to passage into the reaction chamber. Operated at 2.45 GHz, 7 kW plasma power, and a pressure ranging from approximately 0.5 Torr to approximately 10 Torr, the reactant $O_2$ may be decomposed into two O· radicals, Preferably, the remote plasma may be generated with a power ranging from about 1 kW to about 10 kW, more preferably from about 2.5 kW to about 7.5 kW.

The vapor deposition conditions within the chamber allow the disclosed composition and the reactant to react and form a Group 6 transition metal-containing film on the substrate. In some embodiments, Applicants believe that plasma-treating the reactant may provide the reactant with the energy needed to react with the disclosed precursors.

Depending on what type of film is desired to be deposited, an additional precursor may be introduced into the reactor. The precursor may be used to provide additional elements to the Group 6 transition metal-containing film. The additional elements may include lanthanides (Ytterbium, Erbium, Dysprosium, Gadolinium, Praseodymium, Cerium, Lanthanum, Yttrium), zirconium, germanium, silicon, titanium, manganese, ruthenium, bismuth, lead, magnesium, aluminum, or mixtures of these. When an additional precursor compound is utilized, the resultant film deposited on the substrate contains the Group 6 transition metal in combination with at least one additional element.

The Group 6 transition metal-containing film forming compositions and reactants may be introduced into the reactor either simultaneously (chemical vapor deposition), sequentially (atomic layer deposition) or different combinations thereof. The reactor may be purged with an inert gas between the introduction of the composition and the introduction of the reactant. Alternatively, the reactant and the composition may be mixed together to form a reactant/composition mixture, and then introduced to the reactor in mixture form. Another example is to introduce the reactant continuously and to introduce the Group 6 transition metal-containing film forming compositions by pulse (pulsed chemical vapor deposition).

The vaporized composition and the reactant may be pulsed sequentially or simultaneously (e.g. pulsed CVD) into the reactor. Each pulse may last for a time period ranging from about 0.01 seconds to about 10 seconds, alternatively from about 0.3 seconds to about 3 seconds, alternatively from about 0.5 seconds to about 2 seconds. In another embodiment, the reactant may also be pulsed into the reactor. In such embodiments, the pulse of each gas may last for a time period ranging from about 0.01 seconds to about 10 seconds, alternatively from about 0.3 seconds to about 3 seconds, alternatively from about 0.5 seconds to about 2 seconds. In another alternative, the vaporized compositions and reactants may be simultaneously sprayed from a shower head under which a susceptor holding several wafers is spun (spatial ALD).

Depending on the particular process parameters, deposition may take place for a varying length of time. Generally, deposition may be allowed to continue as long as desired or necessary to produce a film with the necessary properties. Typical film thicknesses may vary from several angstroms to several hundreds of microns, depending on the specific deposition process. The deposition process may also be performed as many times as necessary to obtain the desired film.

In one non-limiting exemplary CVD type process, the vapor phase of the disclosed Group 6 transition metal-containing film forming compositions and a reactant are simultaneously introduced into the reactor. The two react to form the resulting Group 6 transition metal-containing thin film. When the reactant in this exemplary CVD process is treated with a plasma, the exemplary CVD process becomes an exemplary PECVD process. The reactant may be treated with plasma prior or subsequent to introduction into the chamber.

In a second non-limiting exemplary CVD type process, the vapor phase of one of the disclosed Group 6 transition metal-containing film forming compositions, for example $MoO_2Cl_2 \cdot EDA$, is introduced into the reactor set at a temperature ranging from approximately 250° C. to approximately 350° C. No reactant is introduced. Alternatively, additional EDA may be used as a reducing agent. The EDA reacts with the $MoO_2Cl_2$ to produce a shiny, highly conductive, metallic Mo-containing film. Analysis is ongoing, but Applicants believe that the Mo-containing film is Mo, MoC, MoN, or MoCN.

A third non-limiting exemplary CVD type process using the vapor phase of one of the Group 6 transition metal-containing film forming compositions comprising a liquid Mo adducted precursor $MoO_2Cl_2 \cdot L_n$, such as $MoO_2Cl_2 \cdot$(methyl hexanoate)$_2$ is also disclosed. A shower head reactor into which a substrate (e.g. Si wafer) was loaded and either maintained at room temperature or heated to a temperature ranging up to 1000° C., preferably from approximately 100° C. to approximately 700° C., more preferably from approximately 250° C. to approximately 700° C. While heating occurred, the reaction chamber was purged with a flow of nitrogen which was introduced through a port. The reactor chamber was subsequently depressurized to about 10 torr.

After reaching the set temperature, the reaction chamber and substrate (e.g. Si wafer) were allowed to reach thermal equilibrium over a period of approximately 30 minutes. The reactor pressure was then adjusted to about 1 torr.

Hydrogen gas, used as a coreactant, was then introduce into the reactor a flow rate ranging from approximately 1 sccm to approximately 10,000 sccm, preferably from approximately 10 sccm to approximately 1,000 sccm.

When pressure reached an equilibrium, a valve between the canister charged with $MoO_2Cl_2 \cdot L$ liquid adduct was opened and vapors of adducted molecule were delivered into the reactor chamber causing a metal film deposited on the substrate (e.g. Si wafer). Argon carrier gas used.

After deposition time was ended, the chamber is re-pressurized with nitrogen to atmospheric pressure while maintaining temperature. The deposited substrate (e.g. Si wafer) is removed to a nitrogen saturated chamber for cooling to ambient temperature. The thickness of the deposited metal film on the wafer is measured by SEM. The composition of the metal film is checked by XPS and/or EDX.

In one non-limiting exemplary ALD type process, the vapor phase of the disclosed Group 6 transition metal-containing film forming compositions is introduced into the reactor, where it is contacted with a suitable substrate. Excess composition may then be removed from the reactor by purging and/or evacuating the reactor. A desired gas (for example, $H_2$) is introduced into the reactor where it reacts with the adsorbed composition in a self-limiting manner. Any excess reducing gas is removed from the reactor by purging and/or evacuating the reactor. If the desired film is a Group 6 transition metal-containing film, this two-step process may provide the desired film thickness or may be repeated until a film having the necessary thickness has been obtained.

Alternatively, if the desired film contains Group 6 transition metal and a second element, the two-step process above may be followed by introduction of the vapor of an additional precursor into the reactor. The additional precursor will be selected based on the nature of the Group 6 transition metal film being deposited. After introduction into the reactor, the additional precursor is contacted with the substrate. Any excess precursor is removed from the reactor by purging and/or evacuating the reactor. Once again, a desired gas may be introduced into the reactor to react with the adsorbed precursor. Excess gas is removed from the reactor by purging and/or evacuating the reactor. If a desired film thickness has been achieved, the process may be terminated. However, if a thicker film is desired, the entire four-step process may be repeated. By alternating the provision of the Group 6 transition metal-containing film forming compositions, additional precursor, and reactant, a film of desired composition and thickness can be deposited.

When the reactant in this exemplary ALD process is treated with a plasma, the exemplary ALD process becomes an exemplary PEALD process. The reactant may be treated with plasma prior or subsequent to introduction into the chamber.

In a second non-limiting exemplary ALD type process, the vapor phase of one of the disclosed Group 6 transition metal-containing film forming compositions, for example $MoO_2Cl_2$, is introduced into the reactor, where it is contacted with a TiN substrate. Excess composition may then be removed from the reactor by purging and/or evacuating the reactor. A desired gas (for example, $O_3$) is introduced into the reactor where it reacts with the absorbed precursor in a self-limiting manner to form a molybdenum oxide film. Any excess oxidizing gas is removed from the reactor by purging and/or evacuating the reactor. These two steps may be repeated until the molybdenum oxide film obtains a desired thickness, typically around 10 angstroms. $ZrO_2$ may then be deposited on the $MoO_x$ film, wherein x is inclusively 2-3. For example, $ZrCp(NMe_2)_3$ may serve as the Zr precursor. The second non-limiting exemplary ALD process described above using $MoO_2Cl_2$ and ozone may then be repeated on the $ZrO_2$ layer, followed by deposition of TiN on the $MoO_x$ layer. The resulting $TiN/MoO_x/ZrO_2/MoO_x/TiN$ stack may be used in DRAM capacitors.

The Group 6 transition metal-containing films resulting from the processes discussed above may include a pure Group 6 transition metal (M=Mn or W), Group 6 transition metal silicide ($M_kSi_l$), Group 6 transition metal oxide ($M_nO_m$), Group 6 transition metal nitride ($M_oN_p$) film, Group 6 transition metal carbide ($M_qC_r$) film, or a Group 6 transition metal carbonitride ($MC_pN_p$) wherein k, l, m, n, o, p, q, and r are integers which inclusively range from 1 to 6. One of ordinary skill in the art will recognize that by judicial selection of the appropriate disclosed Group 6 transition metal-containing film forming compositions, optional precursors, and reactants, the desired film composition may be obtained.

For example, the deposition of pure tungsten may be used to fill the holes that make contact to the transistor source and drain ("contact holes") and also to fill vias between successive layers of metal. This approach is known as a "tungsten plug" process. The usage of tungsten may be developed due to the good properties of the films deposited using $WF_6$. However, it is necessary to provide an adhesion/barrier layer such as Ti/TiN to protect the underlying Si from attack by fluorine and to ensure adhesion of tungsten to the silicon dioxide.

Alternatively, tungsten-silicide may be used on top of polysilicon gates to increase conductivity of the gate line and thus increase transistor speed. This approach is popular in DRAM fabrication, where the gate is also the word line for the circuit. $WF_6$ and $SiH_4$ may be used, but dichlorosilane ($SiCl_2H_2$) is more commonly employed as the silicon source, since it allows higher deposition. temperatures and thus results in lower fluorine concentration in the deposited film.

In another alternative, e tungsten nitride ($WN_x$) or Molybdenum nitride ($MoN_x$) are considered to be a good barrier against diffusion of copper in microelectronics circuits. $WN_x$ and $MoN_x$ may also be used in electrodes for thin-film capacitors and field-effect transistor.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the Group 6 transition metal-containing film may be exposed to a temperature ranging from approximately 200° C. and approximately 1000° C. for a time ranging from approximately 0.1 second to approximately 7200 seconds under an inert atmosphere, a H-containing atmosphere, a N-containing atmosphere, an O-containing atmosphere, or combinations thereof, Most preferably, the temperature is 400° C. for 3600 seconds under a H-containing atmosphere or an O-containing atmosphere. The resulting film may contain fewer impurities and therefore may have an improved density resulting in improved leakage current. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially thermal annealing, has been found effective to reduce carbon and nitrogen contamination of the Group 6 transition metal-containing film. This in turn tends to improve the resistivity of the film.

After annealing, the tungsten-containing films deposited by any of the disclosed processes may have a bulk resistivity at room temperature of approximately 5.5 μohm·cm to approximately 70 μohm·cm, preferably approximately 5.5 μohm·cm to approximately 20 μohm·cm, and more preferably approximately 5.5 μohm·cm to approximately 12 μohm·cm. After annealing, the molybdenum-containing films deposited by any of the disclosed processes may have a bulk resistivity at room temperature of approximately 50 μohm·cm to approximately 1,000 μohm·cm. Room temperature is approximately 20° C. to approximately 28° C. depending on the season. Bulk resistivity is also known as volume resistivity. One of ordinary skill in the art will recognize that the bulk resistivity is measured at room temperature on W or Mo films that are typically approximately 50 nm thick. The bulk resistivity typically increases for thinner films due to changes in the electron transport mechanism. The bulk resistivity also increases at higher temperatures.

In another alternative, the disclosed Group 6 transition metal-containing film forming compositions may be used as doping or implantation agents. Part of the disclosed composition may be deposited on top of the film to be doped, such as an indium oxide ($In_2O_3$) film, vanadium dioxide ($VO_2$) film, a titanium oxide film, a copper oxide film, or a tin dioxide ($SnO_2$) film. The molybdenum or tungsten then diffuses into the film during an annealing step to form the molybdenum-doped films {(Mo)$In_2O_3$, (Mo)$VO_2$, (Mo)TiO, (Mo)CuO, or (Mo)$SnO_2$} or tungsten-doped films {(W)$In_2O_3$, (W)$VO_2$, (W)TiO, (W)CuO, or (W)$SnO_2$}. See, e.g., US2008/0241575 to Lavoie et al., the doping method of which is incorporated herein by reference in its entirety. Alternatively, high energy ion implantation using a variable energy radio frequency quadrupole implanter may be used to dope the molybdenum or tungsten of the disclosed compositions into a film. See, e.g., Kensuke et al., JVSTA 16(2) March/April 1998, the implantation method of which is incorporated herein by reference in its entirety. In another alternative, plasma doping, pulsed plasma doping or plasma immersion ion implantation may be performed using the disclosed compositions. See, e.g., Felch et al., Plasma doping for the fabrication of ultra-shallow junctions Surface Coatings Technology, 156 (1-3) 2002, pp. 229-236, the doping method of which is incorporated herein by reference in its entirety.

EXAMPLES

The following non-limiting examples are provided to further illustrate embodiments of the invention. However, the examples are not intended to be all inclusive and are not intended to limit the scope of the inventions described herein.

Example 1: Synthesis of $MoO_2Cl_2(L)_n$

All reactions were carried out in dried glassware under an oxygen-free nitrogen atmosphere using a glove box and standard Schlenk techniques. All reagents were purchased commercially and used as received.

Inside a glove box, a 13 mL glass vial was loaded with 1 g (0.005 mol) of solid $MoO_2Cl_2$. An excess of the appropriate adduct was added dropwise (see Table 1 for details) Dichloromethane (DCM) was sometimes used as a solvent to promote solid-liquid mixing and to facilitate work up. One of ordinary skill in the art will recognize that other solvents may be used in place of DCM, including, but not limited to dichloroethane, 1-chlorobenzene, 2-methyltetrahydrofuran or a 3:1 mixture of ethyl acetate:ethanol. The mixture was allowed to react at room temperature for 10 minutes to 48 hours. In small scales, the reaction typically takes place in approximately 5 to approximately 10 minutes. Larger scale reactions will obviously take longer. The supernatant liquid was filtered through a PTFE filter. The filtrate was evaporated under vacuum to remove solvent and/or excess ligand yielding the pure $MoO_2Cl_2·L_n$ oil or solid.

TABLE 1

| Product Formula[1] | Adducting Ligand | Ligand CAS # | Ligand Equiv[2] | Solvent | Product Properties | $VP^3$ at ~100 C (torr) |
|---|---|---|---|---|---|---|
| $MoO_2Cl_2$·(tBuCN) | Pivalonitrile | 630-18-3 | 3 | None | White crystalline solid | ~8.1 |
| $MoO_2Cl_2$·(nPrCN) | Butyronitrile | 109-74-0 | 5-6 | None | White waxy solid | ~8.0 |
| $MoO_2Cl_2$·($nC_5H_{11}C-CN$)$_2$ | Hexanenitrile | 628-73-9 | 5-6 | None | Pale yellow solid | ~8.2 |
| $MoO_2Cl_2$·(iBuCN)$_2$ | Isovaleronitrile | 625-28-5 | 5-6 | None | White solid | ~5.9 |
| $MoO_2Cl_2$·(iPrCN)$_2$ | Isobutyronitrile | 78-82-0 | 5-6 | None | White waxy solid | ~10.0 |
| $MoO_2Cl_2$·(VA) | Valeric anhydride (VA) | 2082-59-9 | 5-6 | None | White solid | N/A[4] |
| $MoO_2Cl_2$·(H—C(=O)—N"Bu$_2$)$_2$ | N,N'-dibutyl formamide | 761-65-9 | 3 | None | Pale yellow oil | ~1.7 |
| $MoO_2Cl_2$·(H—C(=O)—N"Et$_2$)$_2$ | N,N'-diethyl formamide | 617-84-5 | 3 | DCM | White solid | ~0.4 |
| $MoO_2Cl_2$·(Me—C(=O)—N"Et$_2$)$_2$ | N,N'-diethyl acetamide | 685-91-6 | 2 | None | Pale green waxy solid | ~0.27 |
| $MoO_2Cl_2$·(TPMA) | N,N,N',N'-tetra Propylmalon amide (TPMA) | 143356-43-8 | 1.5 | DCM | Green heavy oil | ~0.35 |
| $MoO_2Cl_2$·($CH_3C(O)C_4H_9$)$_2$ | 2-hexanone | 591-78-6 | 3 | None | Blue Oil | ~14 at ~93 C |
| $MoO_2Cl_2$·(MH)2 | Methyl hexanoate (MH) | 106-70-7 | 3 | None | Pale blue oil | ~14 |
| $MoO_2Cl_2$·(AA)$_2$ | Amyl acetate (AA) | 628-63-7 | 3 | None | Pale blue oil | ~8.5 |
| $MoO_2Cl_2$·($Et_2O$)$_2$ | Diethyl ether | 115-10-6 | 10 | None | Pale green solid | ~14.5 |

TABLE 1-continued

| Product Formula[1] | Adducting Ligand | Ligand CAS # | Ligand Equiv[2] | Solvent | Product Properties | VP[3] at ~100 C (torr) |
|---|---|---|---|---|---|---|
| $MoO_2Cl_2 \cdot (Bu_2O)_2$ | Dibutyl ether | 142-96-1 | 5 | None | Blue solid | N/A[4] |
| $MoO_2Cl_2 \cdot (EGBE)$ | Ethylene glycol dibutyl ether (EGBE) | 112-48-1 | 1.1 | None | Blue Oil | ~0.5 |
| $MoO_2Cl_2 \cdot (EGEE)$ | Ethylene glycol diethyl ether (EGEE) | 629-14-1 | 3 | None | White solid | ~0.5 |
| $MoO_2Cl_2 \cdot (SPr_2)_2$ | Dipropyl sulfide | 111-47-7 | 2 | None | Green oil | N/A[4] |
| $MoO_2Cl_2 \cdot (2-Me-cSC_4H_8)_2$ | 2-Methyl tetra hydrothiophne | 1795-09-1 | 2 | None | Green oil | N/A[4] |
| $MoO_2Cl_2 \cdot (SEt_2)_2$ | Diethyl sulfide | 352-93-2 | 2 | None | Green oil | N/A[4] |

Figure 7:
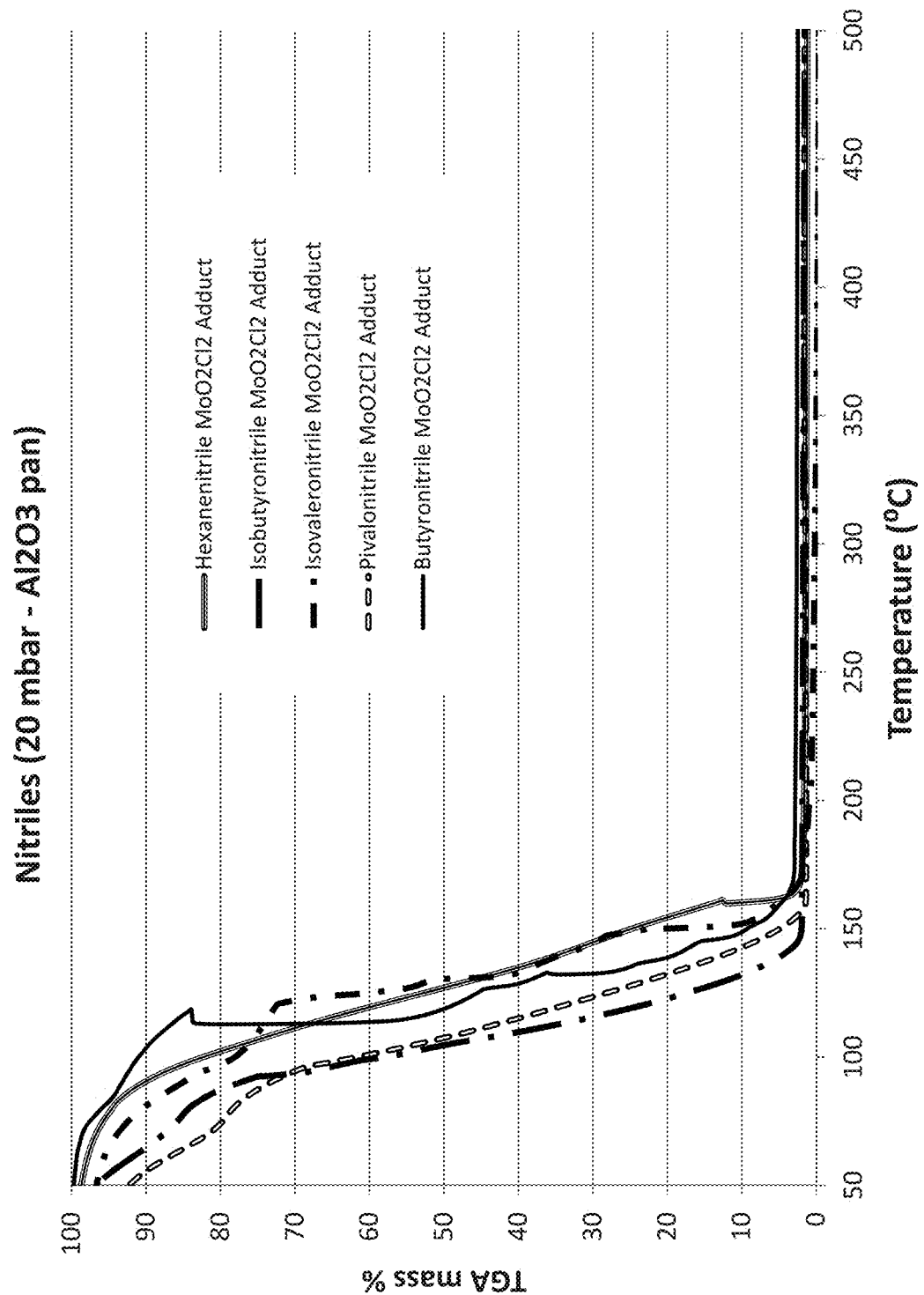
FIG. 7 is a ThermoGravimetric Analysis (TGA) graph illustrating the percentage of weight loss of $MoO_2Cl_2 \cdot L_n$, wherein L is the specified nitrile and n is 1 or 2, upon temperature increase.

[1]Except for the bulky pivalonitrile and bidentate ligands, Applicant believes that most of the adducts form $MoO_2Cl_2 \cdot L_2$, but testing is ongoing to confirm.
[2]The excess amount of molar equivalents of adduct added dropwise to $MoO_2Cl_2$.
[3]Vapor pressure-as calculated from TGA.
[4]N/A = Not available FIG. 7 is a ThermoGravimetric Analysis (TGA) graph illustrating the percentage of weight loss upon temperature increase of $MoO_2Cl_2 \cdot L_2$, wherein a solid line is for L=butyronitrile, a solid short dash-dot is for L=isovalerontrile, a solid long dash-dot is for L=isobutyronitrile, an empty dash is for L=pivalontrile, and a double empty line is for L=hexanenitrile.

Figure 8:
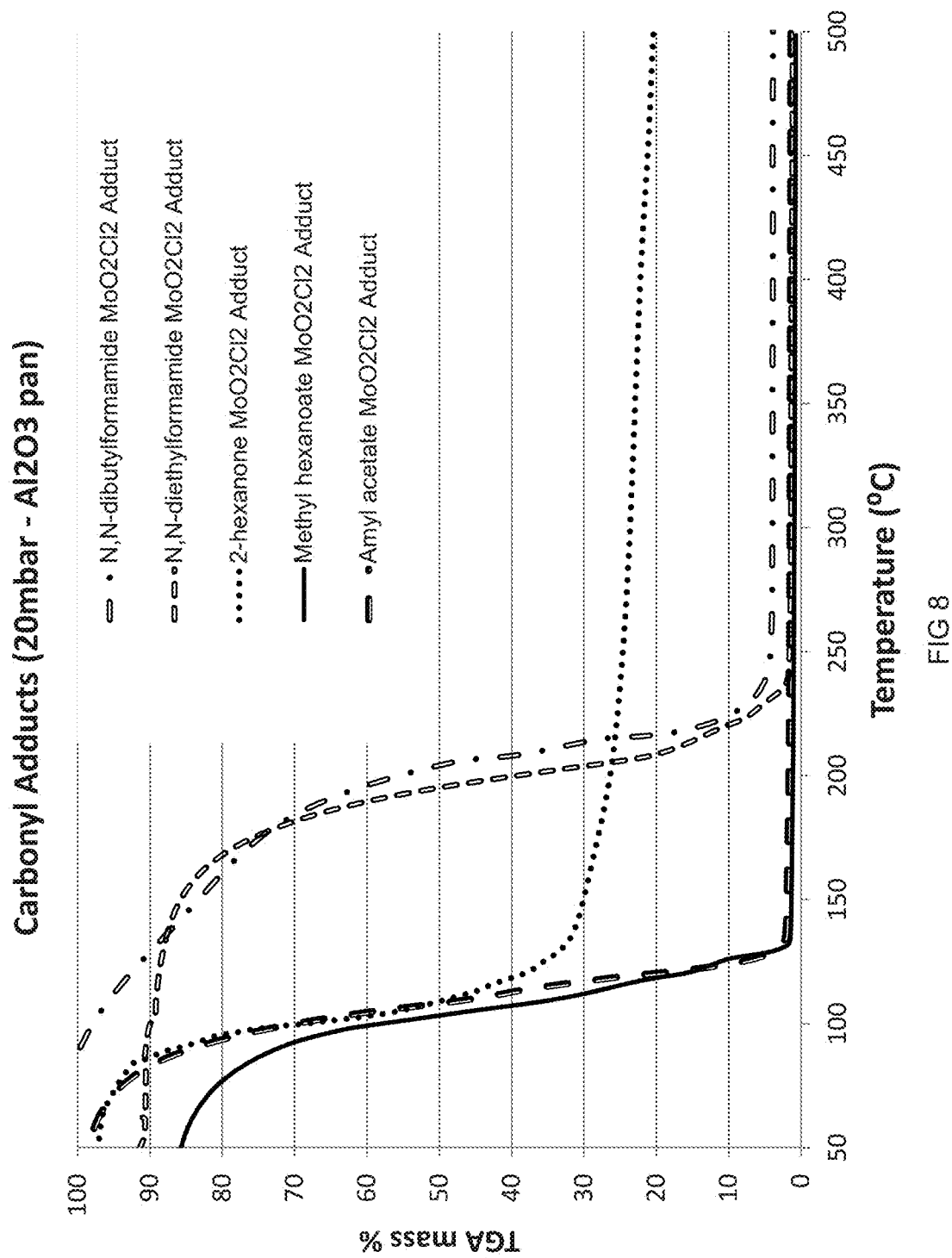
FIG. 8 is a TGA graph illustrating the percentage of weight loss of $MoO_2Cl_2 \cdot L_n$, wherein L is dibutylformamide, diethylformamide, 2-hexanone, methyl hexanoate, or amyl acetate, and n is 1 or 2, upon temperature increase.

FIG. 8 is a TGA graph illustrating the percentage of weight loss upon temperature increase of $MoO_2Cl_2 \cdot L_2$, wherein a solid line is for L=methyl hexanoate, a half solid-half empty dash line is for L=amyl acetate, a dotted line is for L=2-hexanone, an empty dashed line is for L=N,N-diethylformamide, and a dot-empty dash line is for N,N-dibutylformamide.

Figure 9:
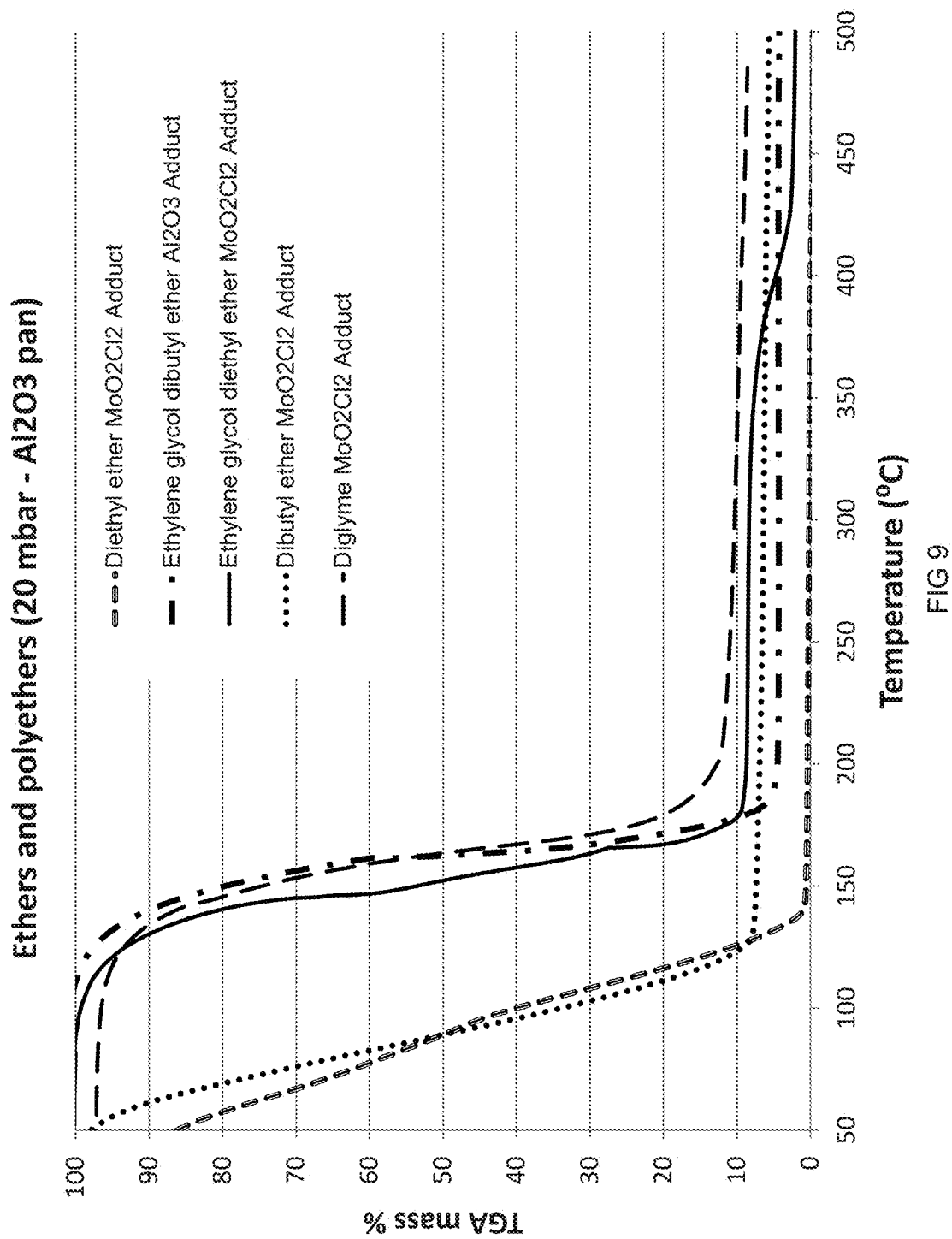
FIG. 9 is a TGA graph illustrating the percentage of weight loss of $MoO_2Cl_2 \cdot L_n$, wherein L is diethy ether, dibutyl ether, ethylene glycol dibutyl ether, ethylene glycol diethyl ether, or diglyme, and n is 1 or 2, upon temperature increase.

FIG. 9 is a TGA graph illustrating the percentage of weight loss upon temperature increase of $MoO_2Cl_2 \cdot L_n$, wherein a solid line is for L=ethylene glycol diethyl ether, a dotted line is for L=dibutyl ether, a solid dashed line is for L=diglyme, two empty dashed lines is for L=diethy ether, and a dot-solid dash line is for L=ethylene glycol dibutyl ether.

Figure 10:
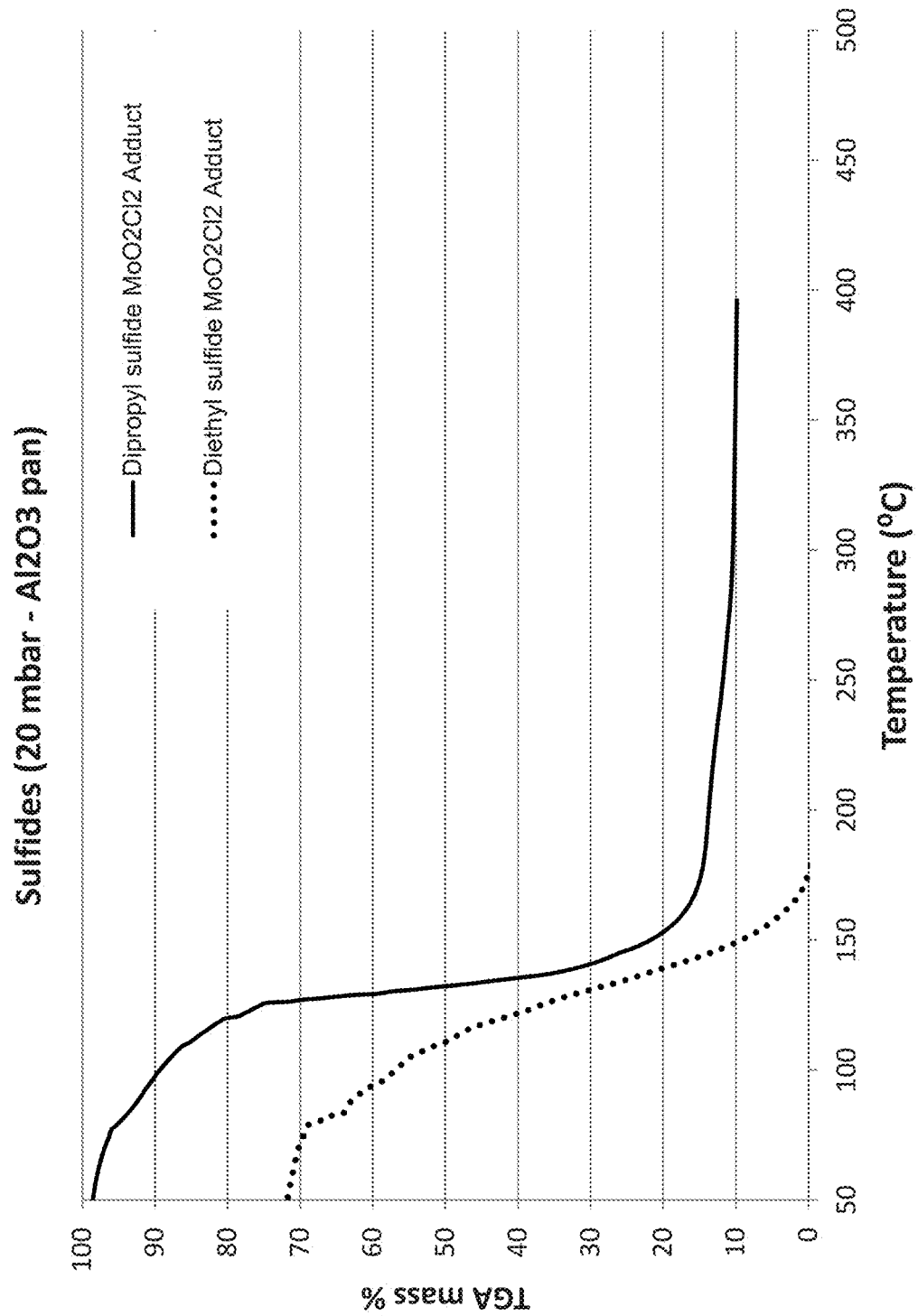
FIG. 10 is a TGA graph illustrating the percentage of weight loss of $MoO_2Cl_2 \cdot L_n$, wherein L is diethy sulfide or dipropyl sulfide, and n is 1 or 2, upon temperature increase.

FIG. 10 is a TGA graph illustrating the percentage of weight loss upon temperature increase of $MoO_2Cl_2 \cdot L_2$, wherein a solid line is for L=dipropyl sulfide and a dotted line is for L=diethyl sulfide. The blank subtract was inadvertently omitted form the TGA curve for $MoO_2Cl_2 \cdot (SEt_2)_2$ and, as a result, part of the curve is below the x axis.

One of ordinary skill in the art will recognize that vapour deposition is typically performed under vacuum and that the results from atmospheric TGA are typically worse than those from vacuum TGA.

Figure 11:
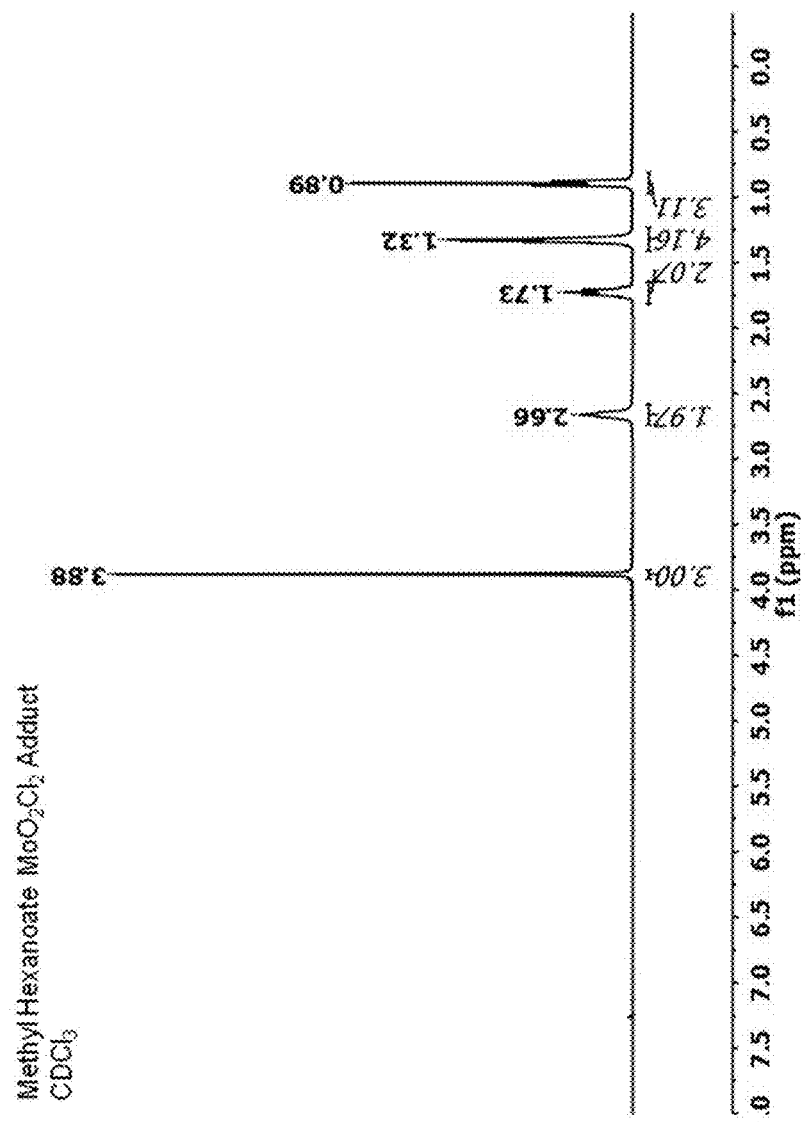
FIG. 11 is the $^1$H NMR spectrum of the $MoO_2Cl_2 \cdot$(Methyl Hexanoate)$_2$ precursor.

FIG. 11 is the $^1$H NMR spectrum of the $MoO_2Cl_2 \cdot (Methyl\ Hexanoate)_2$ precursor.

Figure 12:
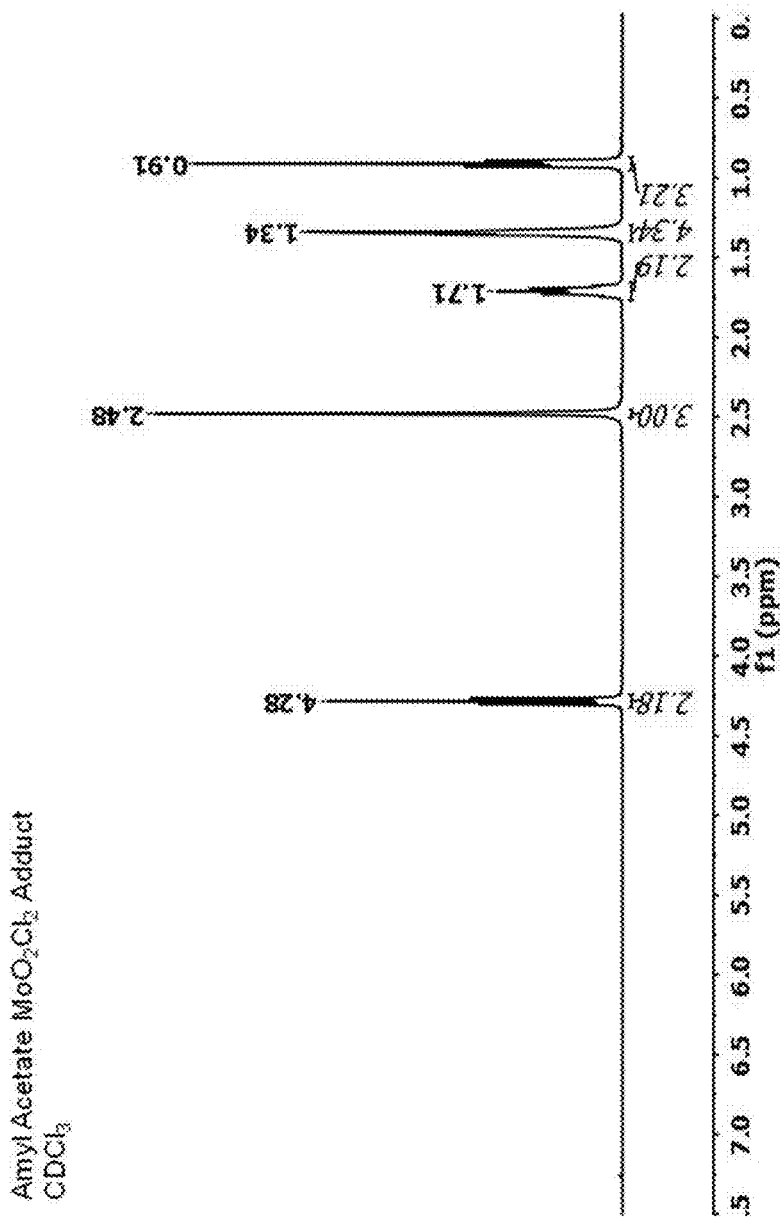
FIG. 12 is the $^1$H NMR spectrum of the $MoO_2Cl_2 \cdot$(Amyl Acetate)$_2$ precursor.

FIG. 12 is the $^1$H NMR spectrum of the $MoO_2Cl_2 \cdot (Amyl\ Acetate)_2$ precursor.

Example 2: Synthesis of the $MoO_2Cl_2(THF)_2$ Intermediate

[*Journal of the American Chemical Society*, 112, 3875]

Inside a glove box, a 13 mL glass vial was loaded with 3 mL of THF at −30° C. to which 1 g of solid $MoO_2Cl_2$ was added in three portions. The reaction took place instantly to form a slightly turbid colorless solution. The reaction product crude was filtered through a PTFE filter. The clear filtrate was evaporated under vacuum to remove excess THF yielding the pure adduct as a white crystalline solid.

Figure 13:
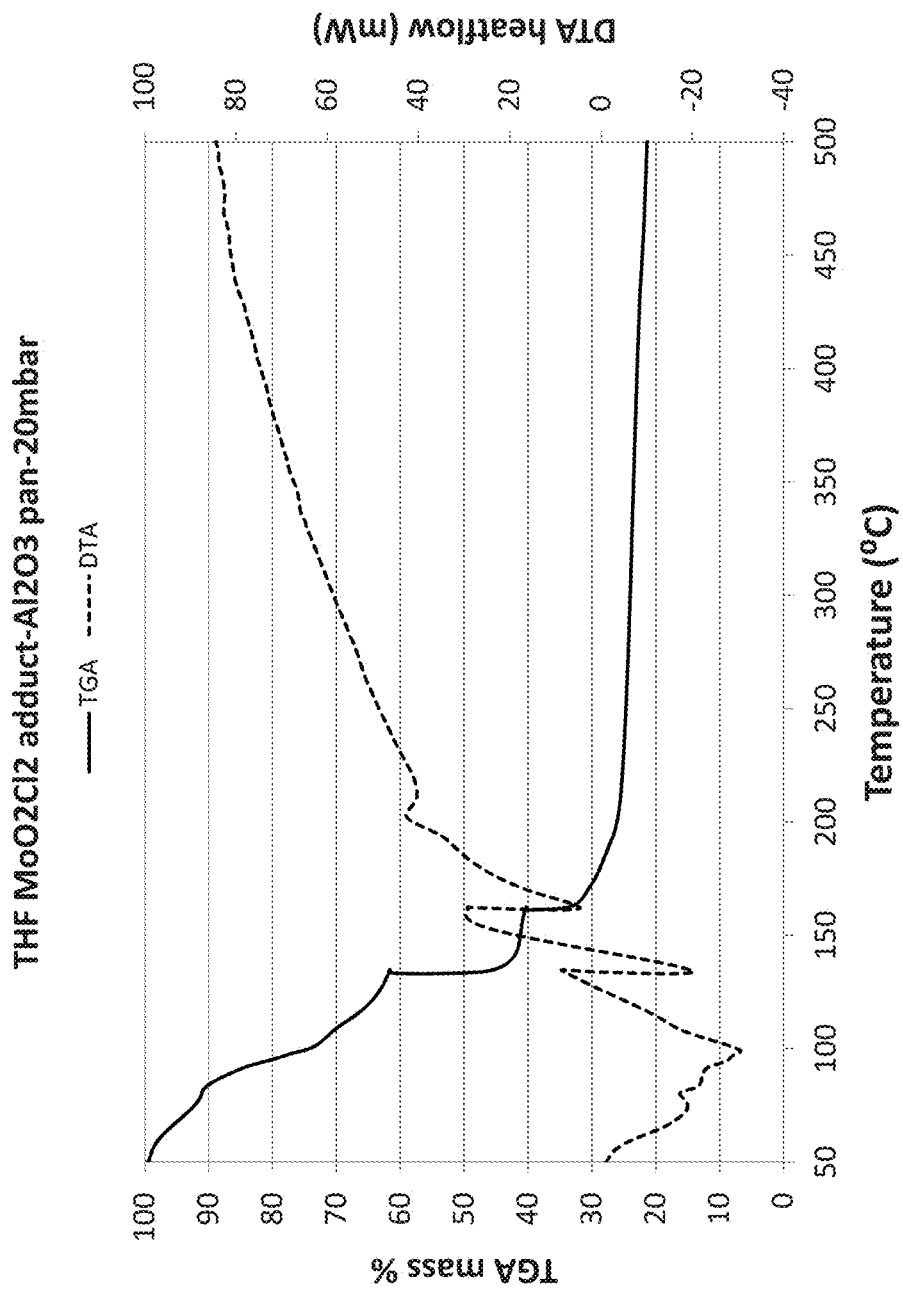
FIG. 13 is a TGA/Differential Thermal Analysis (DTA) graph illustrating the percentage of weight loss (TGA) or the differential temperature (DTA) of $MoO_2Cl_2 \cdot$(THF)$_2$ upon temperature increase.

FIG. 13 is a TGA/Differential Thermal Analysis (DTA) graph illustrating the percentage of weight loss (TGA—solid line) or the differential temperature (DTA—dotted line) of $MoO_2Cl_2 \cdot (THF)_2$ upon temperature increase. While widely used in catalysis, FIG. 13 demonstrates that the thermal properties of the $MoO_2Cl_2 \cdot (THF)_2$ adduct are among the worst tested to date, with several steps indicating differing decomposition/phase change temperatures and high residue. FIG. 13 further demonstrate that this compound would not be viable in vapor deposition processes. Despite its unsatisfactory thermal properties, the $MoO_2Cl_2 \cdot (THF)_2$ adduct is of great synthetic utility as it can be easily used as an intermediate to make other adducts of interest. The THF adducts are not strongly bound to the Mo, allowing "easy" replacement of THF with other adducts (in a two-step one-pot reaction).

Example 3: Adducts Prepared from $MoO_2Cl_2(THF)_2$ Intermediate

Inside a glove box, a 13 mL glass vial was loaded with 3 mL of THF at −30° C. to which 1 g of solid $MoO_2Cl_2$ was added in three portions. The reaction took place instantly to form a slightly turbid colorless solution. An excess of the appropriate adduct was added drop wise (see Table 2 for details). The reaction took place immediately producing a color change. The reaction product crude was filtered through a PTFE filter. The filtrate was evaporated under vacuum to remove excess THF and adduct yielding the pure adduct.

TABLE 2

Figure 14:
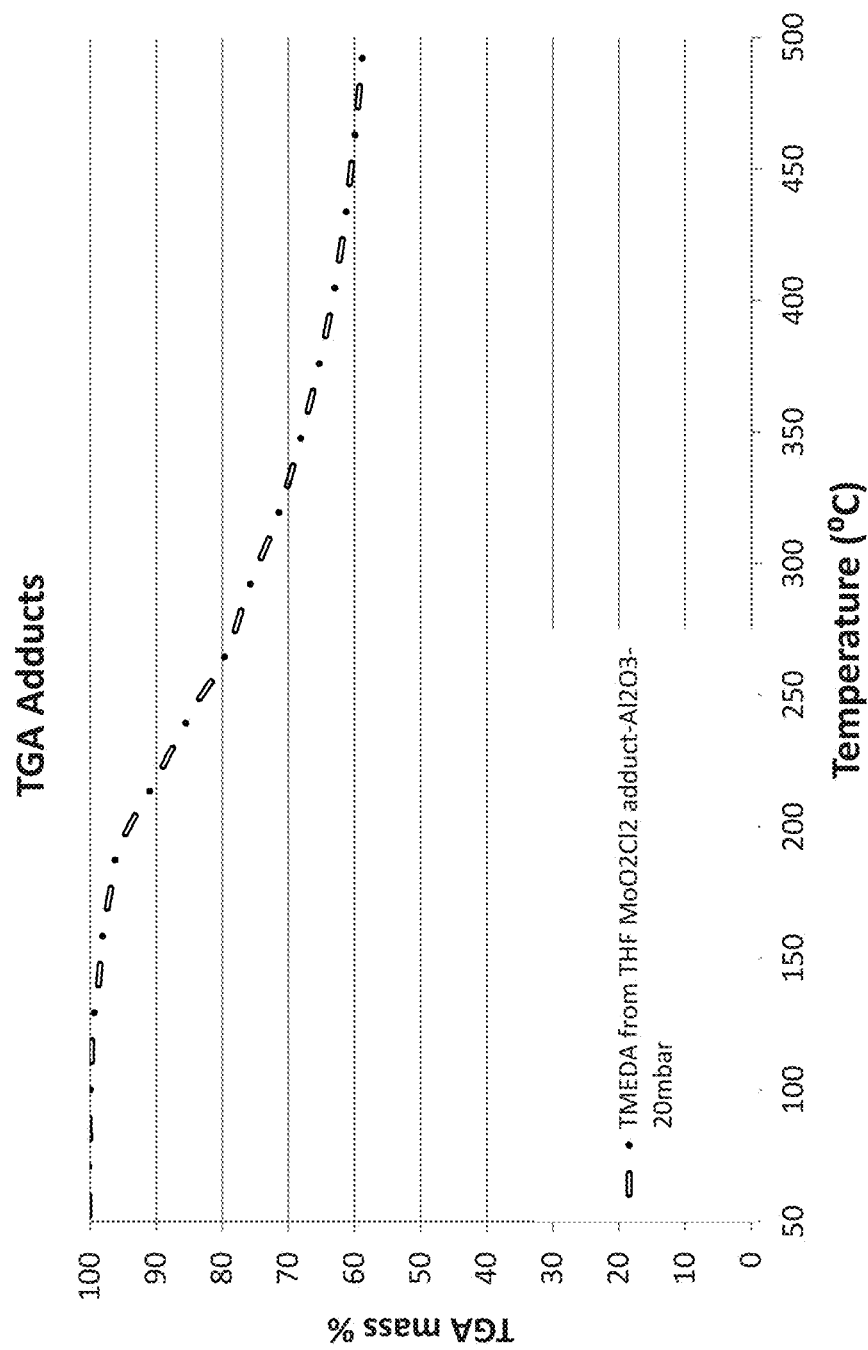
FIG. 14 is a TGA graph illustrating the percentage of weight loss of $MoO_2Cl_2 \cdot L_n$, wherein L is TMEDA, and n is 1 or 2, upon temperature increase.

| Product Formula | Adduct | Adduct CAS # | Adduct Equiv[1] | Product Properties | TGA |
|---|---|---|---|---|---|
| $MoO_2Cl_2 \cdot (TMEDA)$ | Tetramethylene diamine | 110-18-9 | 2 | Brown solid | FIG. 14 |
| $MoO_2Cl_2 \cdot (acac)$ | Acetylacetone | 123-54-6 | 1.5 | White solid | None |

[1]The excess amount of molar equivalents of adduct added dropwise to $MoO_2Cl_2$.

FIG. 14 is a TGA graph illustrating the percentage of weight loss of $MoO_2Cl_2 \cdot L_n$, wherein L is TMEDA and n is 1, upon temperature increase. FIG. 14 demonstrates that this compound would not be viable in vapor deposition processes due to the large amount of residue.

Example 4: Preparation of Heptyl Cyanide $MoO_2Cl_2$ Adduct $MoO_2Cl_2[CH_3(CH_2)_6CN]_2$ Inside a glove box, a 13 mL glass vial was loaded with 1 g of solid $MoO_2Cl_2$, to which 3.84 mL heptyl cyanide were added drop wise. The mixture was allowed to react at room temperature for 20 minutes. The supernatant liquid was filtered through a PTFE filter. The filtrate was washed with cyclohexane (3×5 mL) to remove excess heptyl cyanide. The resulting clear solution was evaporated under vacuum to yield the pure adduct as a pale yellow oil.

Figure 15:
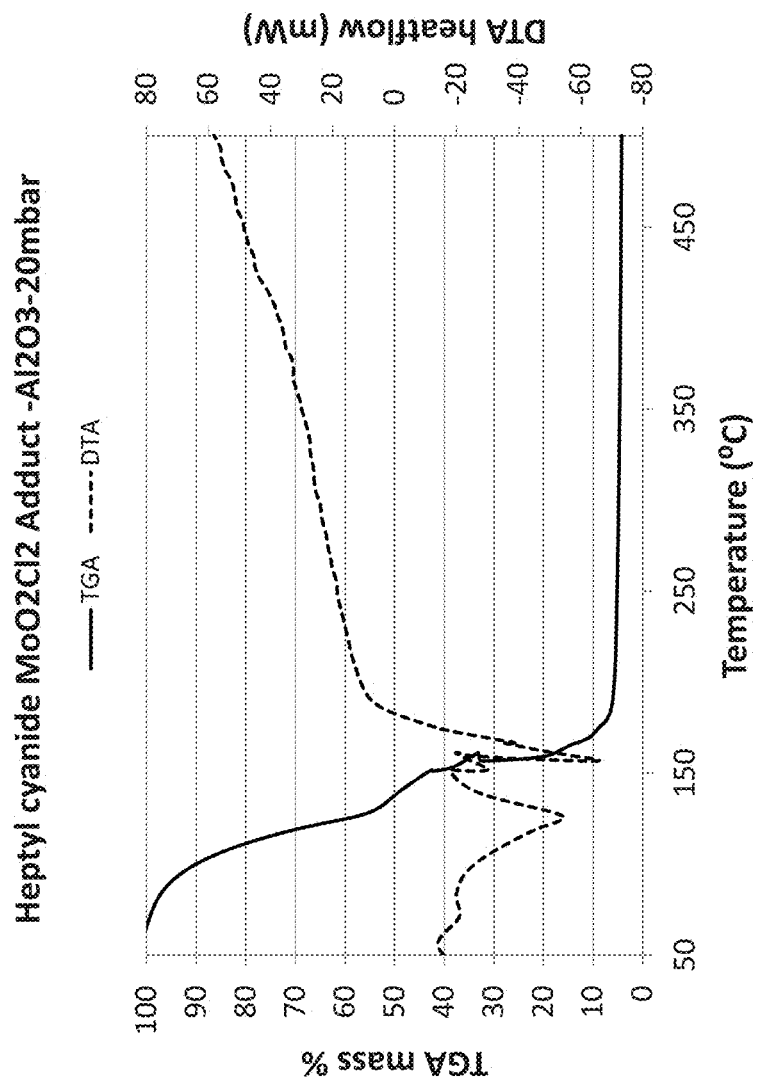
FIG. 15 is a TGA/DTA graph illustrating the percentage of weight loss (TGA—solid line) or the differential temperature (DTA—dotted line) of $MoO_2Cl_2 \cdot (heptyl\ cyanide)_2$ upon temperature increase.

FIG. 15 is a TGA/Differential Thermal Analysis (DTA) graph illustrating the percentage of weight loss (TGA—solid line) or the differential temperature (DTA—dotted line) of $MoO_2Cl_2 \cdot (heptyl\ cyanide)_2$ upon temperature increase.

This example is the same as Example 1, but it includes an additional 3 washings with cyclohexane to remove the excess adduct (heptyl cyanide). This example provides an alternative way to remove adducts that may have especially high boiling points (heptyl cyanide 200° C. approx.). Some of the adducts are not too volatile, so they require long evaporation times under vacuum (sometimes overnight to be 100% sure), slowing the overall synthetic procedure. This example demonstrates that a couple washings in cyclohexane can remove the excess adduct, eliminating the need for long evaporation times.

Example 5: ALD of $Mo(=O)_2Cl_2$

Figure 17:
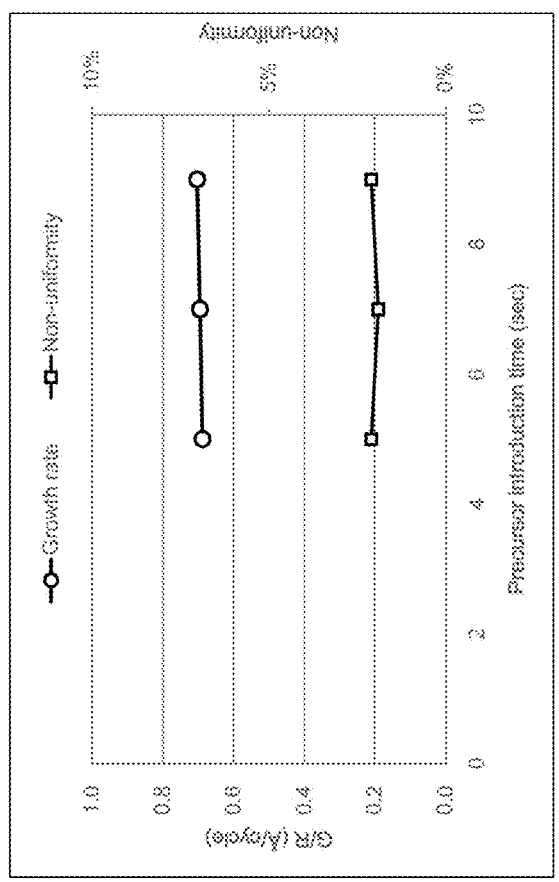
FIG. 17 is a graph of the growth rates of the Mo containing film in ALD mode using the $Mo(=O)_2Cl_2$ as a function of the precursor introduction time at 400° C.
Figure 16:
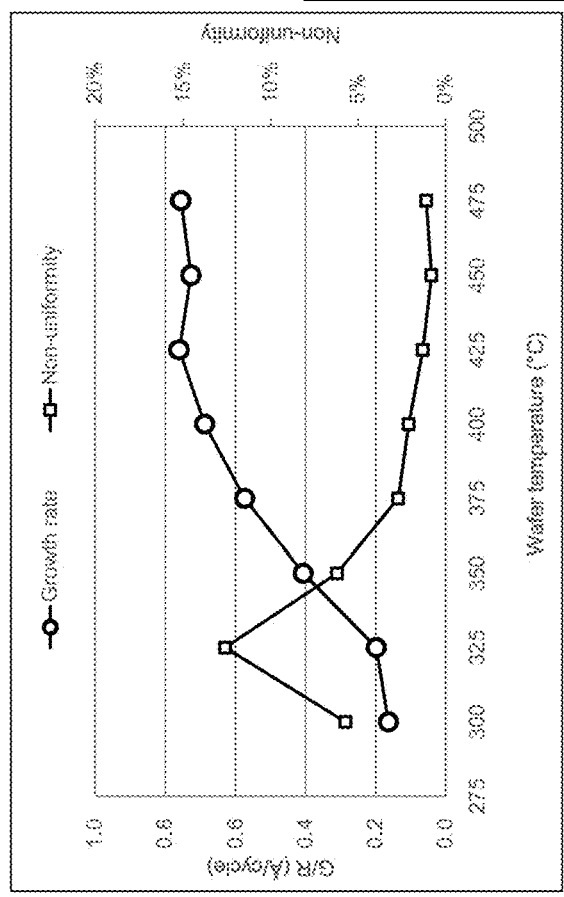
FIG. 16 is a graph of the growth rates of the Mo containing film in ALD mode using $Mo(=O)_2Cl_2$ as a function of the temperature.
Figure 18:
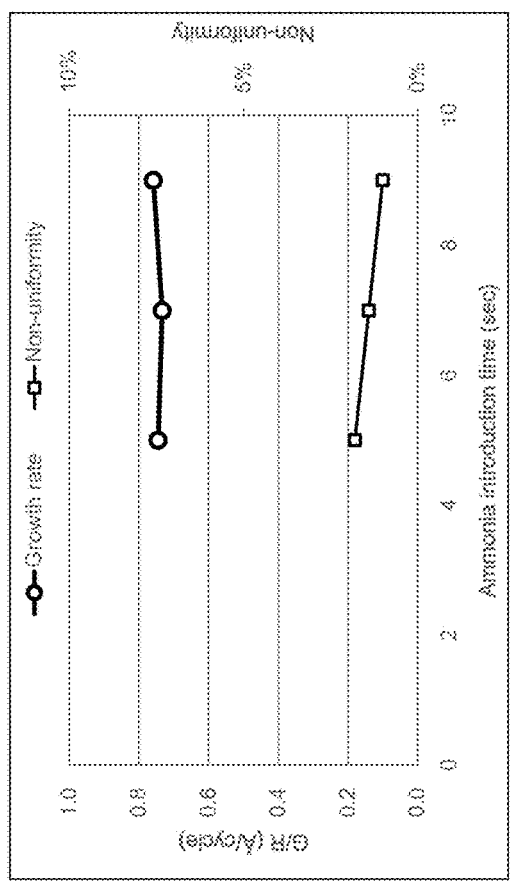
FIG. 18 is a graph of the growth rates of the Mo containing film in ALD mode using the $Mo(=O)_2Cl_2$ as a function of the ammonia introduction time at 400° C.
Figure 19:
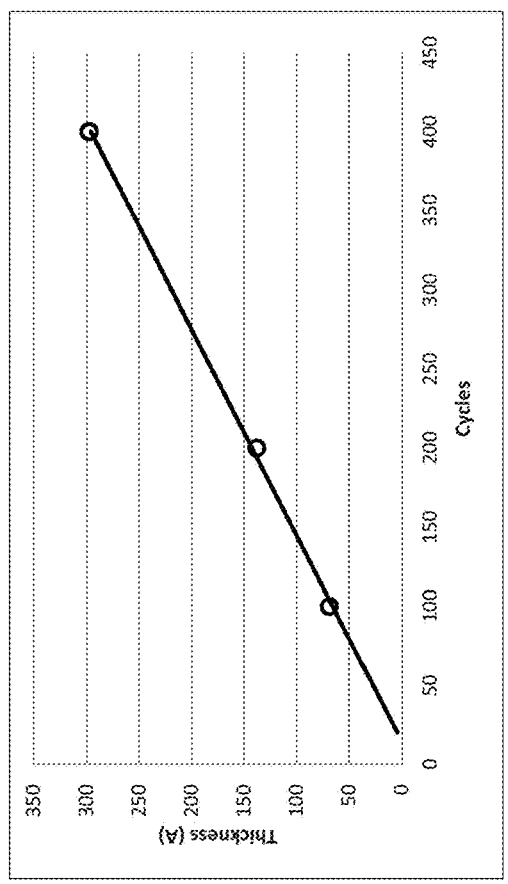
FIG. 19 is a graph of the growth rates of the Mo containing film in ALD mode using the $Mo(=O)_2Cl_2$ as a function of the number of ALD cycle.
Figure 21:
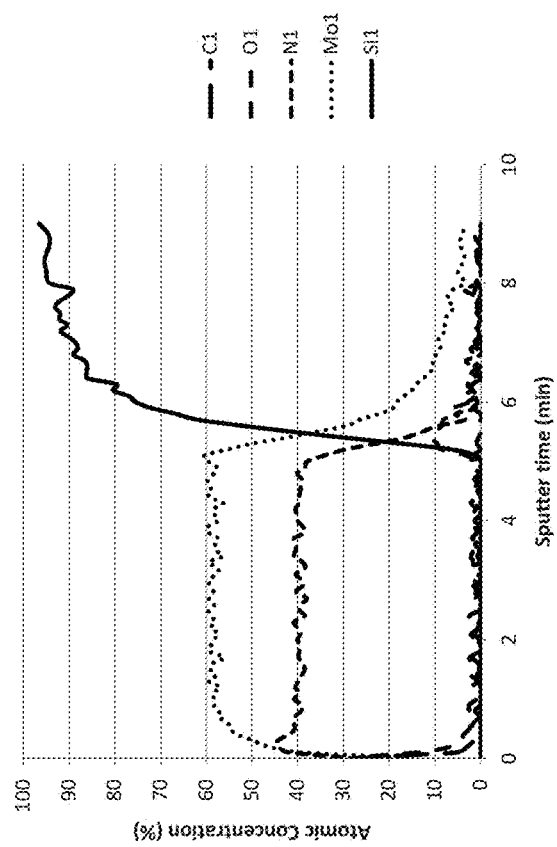
FIG. 21 is an AES graph showing the atomic composition of a MoN film deposited at 425° C. as a function of sputter time.
Figure 20:
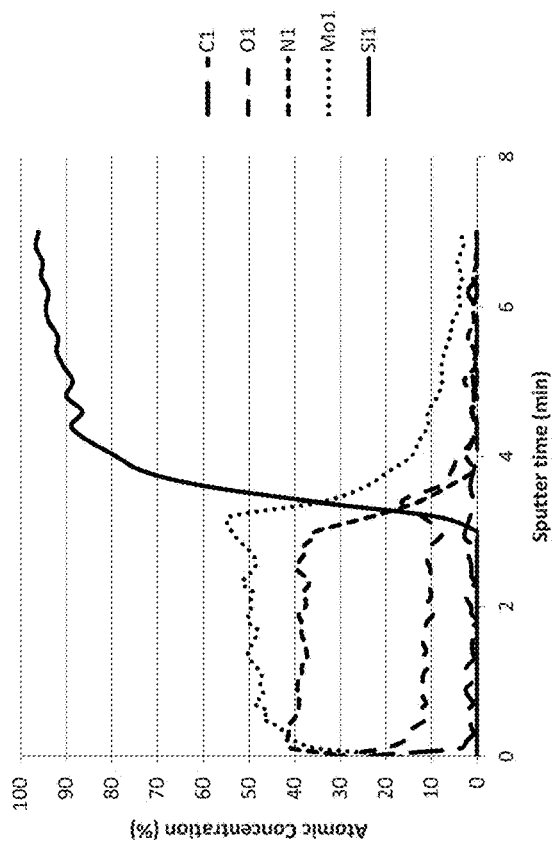
FIG. 20 is an Auger Electron Spectroscopy (AES) graph showing the atomic composition of a MoN film deposited at 400° C. as a function of sputter time.
Figure 23:
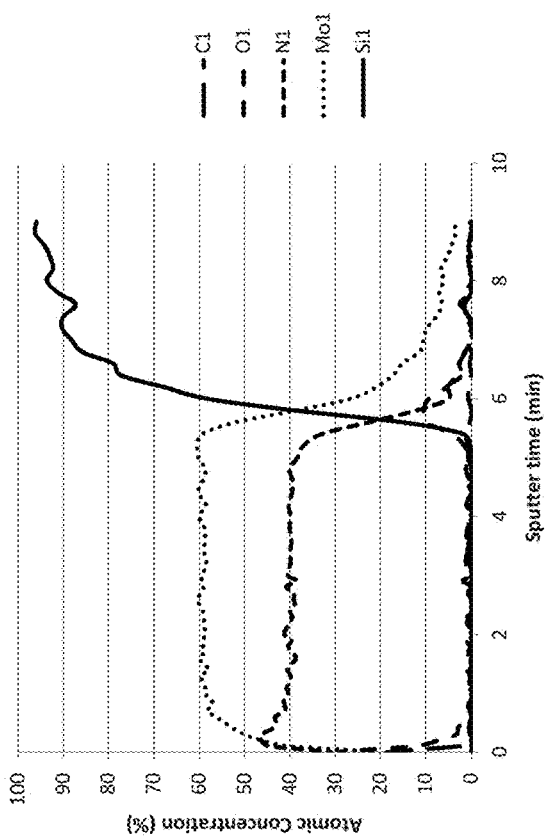
FIG. 23 is an AES graph showing the atomic composition of a MoN film deposited at 475° C. as a function of sputter time.
Figure 22:
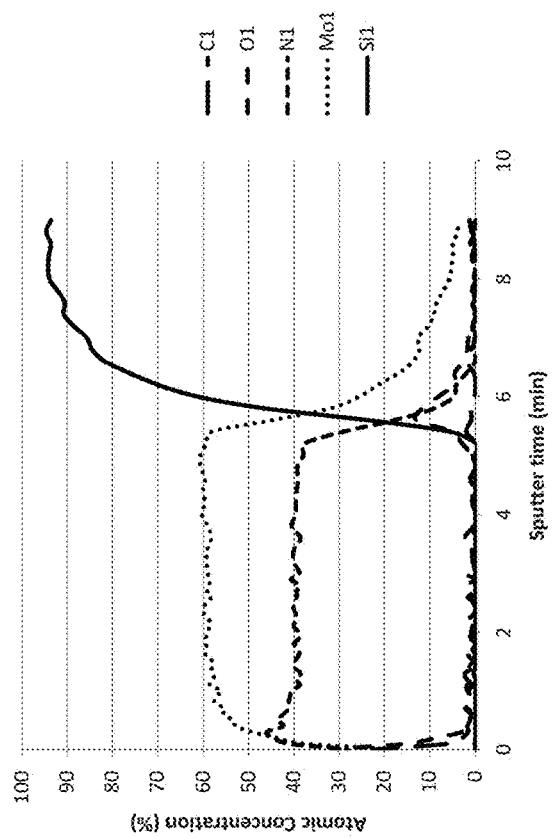
FIG. 22 is an AES graph showing the atomic composition of a MoN film deposited at 450° C. as a function of sputter time.

ALD tests were performed using the $Mo(=O)_2Cl_2$, which was placed in a vessel heated up to 35° C. and $NH_3$ as co-reactant. Typical ALD conditions were used with a reactor pressure fixed at ~0.3 Torr. ALD behavior with complete surface saturation and reaction were assessed in a temperature window of 300-475° C. on pure silicon wafers. FIG. 16 is a graph of the growth rates of the Mo containing film in ALD mode using $Mo(=O)_2Cl_2$ as a function of the temperature. Growth rate was assessed to be ~0.8 Å/cycle between 425 and 475° C. where the growth is stable with the temperature increase. FIG. 17 is a graph of the growth rates of the Mo containing film in ALD mode using the $Mo(=O)_2Cl_2$ as a function of the precursor introduction time at 400° C. The flat growth rate of the of the Mo containing film using the $Mo(=O)_2Cl_2$ as a function of the precursor introduction time demonstrate the surface self limiting properties of the process. FIG. 18 is a graph of the growth rates of the Mo containing film in ALD mode using the $Mo(=O)_2Cl_2$ as a function of the ammonia introduction time at 400° C. FIG. 19 is a graph of the growth rates of the Mo containing film in ALD mode using the $Mo(=O)_2Cl_2$ as a function of the number of ALD cycle. The linear increase of the growth rate with the number of ALD cycle is in agreement with the surface self limiting regime characteristic of the ALD mode.

FIG. 20 to FIG. 23 is a graph of the Auger Electron Spectroscopy (AES) analysis of the films produced at 400, 425, 450 and 475° C. respectively. From 425° C. and above, films were found to be pure Molybdenum nitride. One of ordinary skill in the art will recognize that the same sputter rate may not have been used for each analysis.

Figure 24:
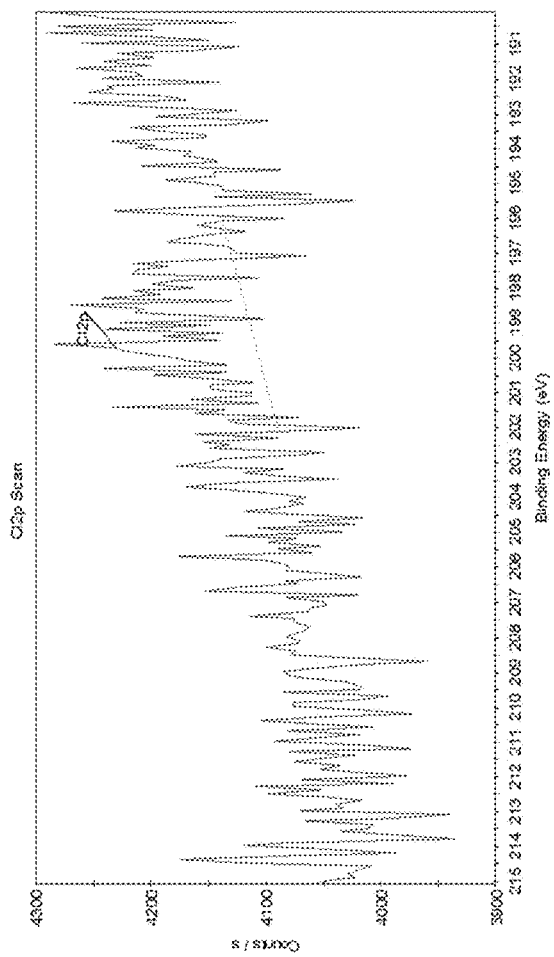
FIG. 24 is a X-Ray Spectroscopy (XPS) graph of the MoN film produced at 400° C. showing the residual amount of chlorine in the film.

FIG. 24 is a X-Ray Spectroscopy (XPS) graph of the MoN film produced at 400° C. showing the residual amount of chlorine in the film.

Figure 25:
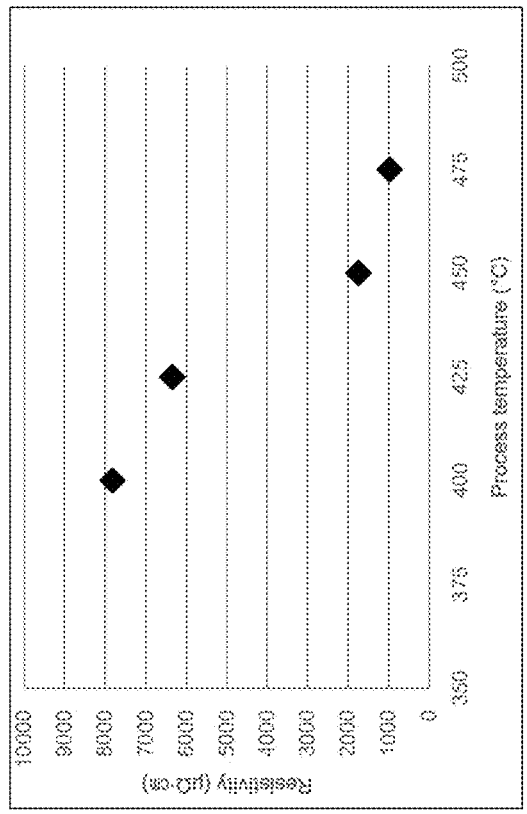
FIG. 25 is a graph of the film resistivities as a function of temperature.

FIG. 25 is a graph of the film resistivities as a function of temperature.

Figure 26:
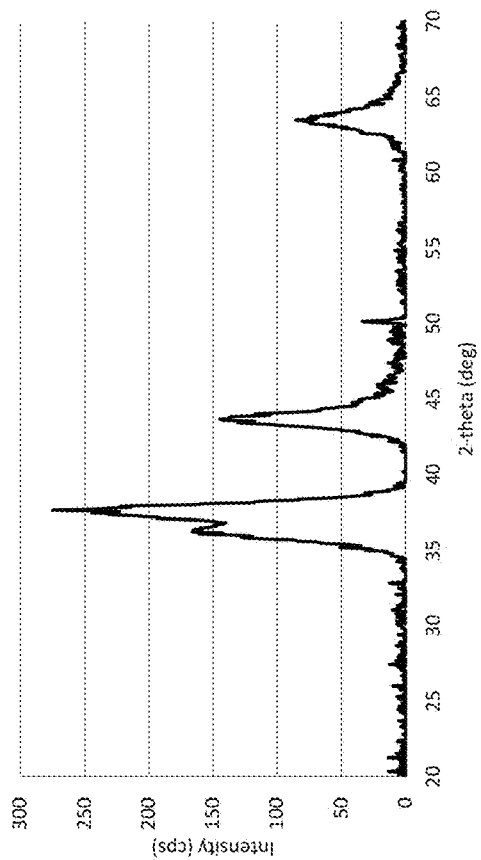
FIG. 26 shows the X-Rays Diffractometry (XRD) analysis of the MoN film produced 475° C. showing the characteristic signals of Molybdenum Nitride.

FIG. 26 shows the X-Rays Diffractometry (XRD) analysis of the MoN film produced 475 OC showing the characteristic signals of Molybdenum Nitride.

Figure 27:
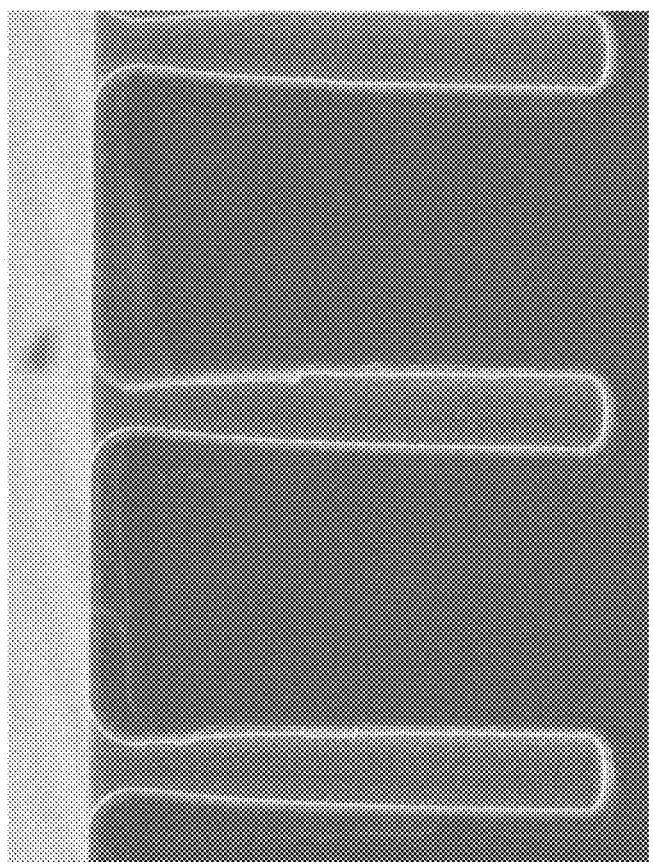
FIG. 27 is a Scanning Electron Microscope (SEM) picture of the film deposited in a 1:10 aspect ratio pattern wafer at 475° C. and shows nearly perfect step coverage performance.

FIG. 27 is a Scanning Electron Microscope (SEM) picture of the film deposited in a 1:10 aspect ratio pattern wafer at 475° C. and shows nearly perfect step coverage performance.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method for deposition of a Group 6 transition metal-containing film on a substrate, the method comprising:

First, introducing a vapor of the Group 6 transition metal-containing film forming composition into a reactor containing a substrate and depositing at least part of the precursor onto the substrate to form the Group 6 transition metal-containing film wherein the composition comprises a precursor having the formula MEE'XX'·$L_n$, wherein M=Mo or W; E and E' independently=O or S; X and X' independently=Cl, Br, or I; L is an adduct; and n=1 or 2, and Second, introducing a vapor or a reactant to thereby form an M containing film selected from a pure M film, an M silicide or germanide film, an M oxide film, an M nitride film, an M dichalcogenide film, or an M oxynitride film.

2. The method of claim 1, wherein the Group 6 transition metal-containing film is selectively deposited onto the substrate.

3. The method of claim 1, wherein L is an ester.

4. The method of claim 1, wherein the precursor is $MoO_2Cl_2(_nC_5H_{11}-CN)_2$, $MoO_2Cl_2 \cdot (methyl\ hexanoate)_2$, $MoO_2Cl_2 \cdot (amyl\ acetate)_2$, or $MoO_2Cl_2 \cdot (_nBu\text{-}O-CH_2-CH_2-O-_nBu)$.

* * * * *